(12) United States Patent
Morimoto

(10) Patent No.: US 7,106,618 B2
(45) Date of Patent: Sep. 12, 2006

(54) METHOD OF DRIVING A NON-VOLATILE MEMORY

(75) Inventor: Kiyoshi Morimoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 125 days.

(21) Appl. No.: 11/006,638

(22) Filed: Dec. 8, 2004

(65) Prior Publication Data

US 2005/0117397 A1    Jun. 2, 2005

Related U.S. Application Data

(63) Continuation of application No. PCT/JP2004/009253, filed on Jun. 24, 2004.

(30) Foreign Application Priority Data

Jun. 25, 2003  (JP)  ............................. 2003-180811

(51) Int. Cl.
 *G11C 11/00* (2006.01)
(52) U.S. Cl. ........................................ 365/148; 365/46
(58) Field of Classification Search ................ 365/46, 365/148
 See application file for complete search history.

(56) References Cited

U.S. PATENT DOCUMENTS

| | | | |
|---|---|---|---|
| 5,280,396 A * | 1/1994 | Hamaguchi et al. | ........... 386/51 |
| 5,296,716 A | 3/1994 | Ovshinsky et al. | |
| 6,314,014 B1 | 11/2001 | Lowrey et al. | |
| 6,512,252 B1 | 1/2003 | Takagi et al. | |
| 6,667,900 B1 * | 12/2003 | Lowrey et al. | .............. 365/171 |
| 6,671,710 B1 * | 12/2003 | Ovshinsky et al. | .......... 708/493 |
| 6,707,712 B1 * | 3/2004 | Lowery | ....................... 365/175 |
| 6,740,921 B1 | 5/2004 | Matsuoka et al. | |
| 6,768,665 B1 * | 7/2004 | Parkinson et al. | ........... 365/113 |
| 6,831,856 B1 * | 12/2004 | Pashmakov | .................. 365/163 |

FOREIGN PATENT DOCUMENTS

| | | |
|---|---|---|
| JP | 2001-210831 | 8/2001 |
| JP | 2003-100991 | 4/2003 |
| JP | 2003-273352 | 9/2003 |

* cited by examiner

*Primary Examiner*—Hoai V. Ho
(74) *Attorney, Agent, or Firm*—McDermott Will & Emery LLP

(57) ABSTRACT

A method of driving a non-volatile memory which comprises a plurality of memory cells arranged in a two dimensional array, each having a field-effect transistor (1) whose gate and substrate are connected and a variable resistor element (2) comprising a phase change material; in which a specific voltage is applied to a specific word line ($WL_i$), bit line ($BL_j$) and voltage supply section (VA) so that a voltage which is higher than a forward rise voltage of the pn junction between the source and substrate of the field-effect transistor (1) is applied between the specific word line ($WL_i$) and bit line ($BL_j$), and then the voltage applied to the word line ($WL_i$) is rapidly or gradually returned to the initial voltage to change an applicable variable resistor element (2) into the high or low resistance state, whereby data is deleted or recorded, and data is read by turning on the field-effect transistor (1) and detecting the resistance value of the applicable variable resistor element (2).

18 Claims, 12 Drawing Sheets

(a)

(b)

(c)

METHOD OF DRIVING A NON-VOLATILE MEMORY

This application is a continuation of PCT/JP2004/009253, filed on Jun. 24, 2004

BACKGROUND OF THE INVENTION (1) Field of the Invention

The present invention relates to a method of driving a non-volatile memory.

(2) Description of the Related Art

In recent years, cellular phones and personal digital assistants (PDA) are increasingly required to handle a large amount of image information, and thus high-speed, low-power-consuming and small-sized non-volatile memories with a high capacity are desired. Especially, so-called phase change memory devices, which use materials whose resistance values are characteristically varied as a whole depending on their crystal states, are recently drawing attention as ultra-highly integrated memory devices which enable non-volatile operation.

This device has a relatively simple structure in which phase change material comprising a plurality of chalcogen elements is sandwiched between two electrode materials. An electric current is applied between two electrodes to give Joule heat to the phase change material, whereby the crystal state of the phase change material is changed between an amorphous phase and a crystalline phase. Thus, recording of data is accomplished. A GeSbTe-based phase change material, for example, usually contains more than one crystal phase mixed together. Therefore, it is theoretically possible to change the resistance value between the two electrodes in an analog manner. For this reason, such phase change materials are expected to be applied to not only digital memories but also analog memories that can record multi-valued data.

Since the crystal state in the memory active region of a phase change material is very stable at room temperature, it is considered that it can retain data for far more than ten years. For example, U.S. Pat. No. 5,296,716 (hereinafter referred to as patent document 1) by Ovshinsky is a reference that shows the technology level of a phase change memory.

Moreover, the constitution of a phase change memory cell using field-effect transistor as switching elements is disclosed in U.S. Pat. No. 6,314,014 (hereinafter referred to as patent document 2) by Lowrey et al.

FIG. 12 illustrates a prior art phase change memory cell using a field-effect transistor, wherein (a), (b) and (c) are the circuit diagram of the phase change memory cell, a cross sectional view of a variable resistor element using the phase change material, and a figure showing the current voltage characteristics of the variable resistor element using the phase change material, respectively. The circuit diagram (a) is similar to that disclosed in the aforementioned patent document 2. This phase change memory cell comprises a field-effect transistor (hereinafter referred to as MOS) 90, a variable resistor element 91 which has a memory function and consists of a phase change material, a bit line BL for data input/output, a word line WL which is connected to a gate electrode and controls data input/output by turning on/off the MOS 90 and a current or voltage supply section VA. The variable resistor element 91 is formed, for example, as shown in (b). Specifically, the variable resistor element 91 comprises an upper electrode 100, a phase change material film 101 such as GeSbTe (germanium, antimony, tellurium), an interlayer insulation film 103 such as a silicone oxide film, a metal plug 104 which operates as a heat generator and a lower electrode 105. A phase change region 102, which contacts the electrode plug 104, within the phase change material film 101, changes its crystal state as described later.

As shown in FIG. 12(c) with dotted lines, when a voltage is applied to the variable resistor element which is highly resistive (amorphous) in the initial state, almost no current flows until a threshold voltage Vth is attained and therefore little heat is generated. The high resistance state (hereinafter also referred to as a reset state) is thus maintained. When the applied voltage exceeds the threshold voltage Vth, part of the phase change material film 101 (phase change region 102 of FIG. 12(b)) is crystallized due to the Joule heat generated by current. This changes the variable resistor element into a low resistance state (hereinafter also referred to as a set state). In this manner, as described above, a memory function can be achieved by associating the resistance values of the variable resistor element using the phase change material in the set state and reset state with, for example, data 1 and 0, respectively. To return the phase change material which has been changed into the low resistance state to the high resistance state (reset state), the variable resistor element may be rapidly cooled after a current higher than a predetermined threshold current value Ith is applied to the variable resistor element.

As shown in FIG. 12(c), the current region I/Ith>1 that can change the variable resistor element into the high resistance state is referred to as a reset current region, and the current region I/Ith=0.6–1 that can change the element into the low resistance state is referred to as a set current region. Reading of the present resistance value of the variable resistor element needs to be done in a low current region I/Ith<0.6 (applied voltage: about 0.45 V or lower) to avoid read disturbance are (change in a resistance value due to a read-out operation). For example, in the memory cell having the constitution shown in FIG. 12(a), it is necessary to set the voltage applied to the voltage supply section VA to 0.45 V or lower when reading a resistance value.

To change the phase change memory into the reset state, however, a high current of 1 mA or higher needs to be applied to each variable resistor element even in a minute element using a 0.18 μm design rule. For this reason, when a MOS is used as an switch element, there have been the problems of an increased occupied area due to an increased channel width and increased power consumption resulting from the necessity to increase the voltage applied to the gate. In addition, at the time of reading a resistance value, as described above, a sufficient voltage cannot be applied between the source and drain of the MOS, i.e., the switching element, to avoid read disturbance. Accordingly, there is the problem that high-speed read operation is difficult, and therefore high-performance switching elements that can provide high driving performance even during low-voltage operation have been required.

LIST OF RELEVANT REFERENCES OF THE PRESENT INVENION

U.S. Pat. No. 5,296,716 (refer to "Description of the Related Art" for details)

U.S. Pat. No. 6,314,014 (refer to "Description of the Related Art" for details)

Japanese Unexamined Patent Publication No. 2003-100991: this reference discloses a non-volatile memory element having a phase change memory connected to the drain region of a MOS transistor.

Japanese Unexamined Patent Publication No. 2001-210831: this reference discloses a DTMOS whose substrate and gate are electrically connected.

BRIEF SUMMARY OF THE INVENTION

An object of the present invention is to solve the above-mentioned problems by providing a method of driving a non-volatile memory cell using, as a switching element, a MOS whose gate and substrate are electrically connected with low power consumption at high efficiency.

A first method of driving a non-volatile memory according to the present invention which attains the above-mentioned object is a method of driving a non-volatile memory which comprises;

a plurality of memory cells arranged in a two dimensional array, each of the memory cells having an n-channel field-effect transistor whose gate and substrate are connected electrically, and a variable resistor element comprising a phase change material and having a first terminal and a second terminal, the first terminal being connected to a source of the field-effect transistor, a word line connected to the gates of the memory cells of each line, a bit line connected to the second terminals of the memory cells of each row, and a common voltage supply section connected to drains of all the field effect transistors;

the method carrying out, when a variable resistor element in a first memory cell is changed into a high resistance state, a first reset step in which an initial voltage is applied to all the word lines and a bit line connected to the first memory cell, and a first voltage which is higher than the initial voltage is applied to the voltage supply section and bit lines other than the bit line connected to the first memory cell, a second reset step in which a second voltage is applied to a word line connected to the first memory cell, the second voltage being, on the basis of the initial voltage, higher than a forward rise voltage of a pn junction of the field-effect transistor, higher than or equal to the first voltage and lower than the sum of the first voltage and the forward rise voltage, whereby a reset current is applied through a variable resistor element of the first memory cell, and a third reset step in which the initial voltage is applied to a word line connected to the first memory cell, the first to third reset steps being carried out in the order stated;

the method carrying out, when a variable resistor element of a second memory cell is changed into a low resistance state, a first set step in which the initial voltage is applied to all the word lines and a bit line connected to the second memory cell, and a third voltage which is higher than the initial voltage is applied to the voltage supply section and bit lines other than the bit line connected to the second memory cell, a second set step in which a fourth voltage is applied to a word line connected to the second memory cell, the fourth voltage being, on the basis of the initial voltage, higher than a forward rise voltage of a pn junction of the field-effect transistor, higher than or equal to the third voltage and lower than the sum of the third voltage and the forward rise voltage, whereby a set current is applied through a variable resistor element of the second memory cell, and a third set step in which the initial voltage is applied to a word line connected to the second memory cell, the first to third set steps being carried out in the order stated;

the method carrying out, when the state of a variable resistor element of a third memory cell is read, a first read step in which a fifth voltage is applied to a word line connected to the third memory cell to turn on a field-effect transistor of the third memory cell, and a current is applied by creating a potential difference between a bit line connected to the third memory cell and the voltage supply section, whereby a value of a current flowing through the variable resistor element of the third memory cell is detected as an amount of a current flowing to the bit line.

A second method of driving a non-volatile memory according to the present invention which attains the above objects is a method of driving a non-volatile memory which comprises;

a plurality of memory cells arranged in a two dimensional array, each of the memory cells having a p-channel field-effect transistor whose gate and substrate are connected electrically, and a variable resistor element comprising a phase change material and having a first terminal and a second terminal, the first terminal being connected to a source of the field-effect transistor, a word line connected to the gates of the memory cells of each line, a bit line connected to the second terminals of the memory cells of each row, and a common voltage supply section connected to drains of all the field effect transistors;

the method carrying out, when a variable resistor element in a first memory cell is changed into a high resistance state, a first reset step in which an initial voltage is applied to all the word lines and a bit line connected to the first memory cell, and a first voltage which is lower than the initial voltage is applied to the voltage supply section and bit lines other than the bit line connected to the first memory cell, a second reset step in which a second voltage which is lower than the initial voltage and causes a forward rise current to flow through a pn junction of the field-effect transistor is applied to the word line connected to the first memory cell, whereby a reset current is applied through a variable resistor element of the first memory cell, and a third reset step in which the initial voltage is applied to the word line connected to the first memory cell, the first to third reset steps being carried out in the order stated;

the method carrying out, when a variable resistor element of a second memory cell is changed into a low resistance state, a first set step in which the initial voltage is applied to all the word lines and a bit line connected to the second memory cell, and a third voltage which is lower than the initial voltage is applied to the voltage supply section and bit lines other than the bit line connected to the second memory cell, a second set step in which a fourth voltage which is lower than the initial voltage and causes a forward rise current to flow through a pn junction of the field-effect transistor is applied to the word line connected to the second memory cell, whereby a set current is applied through a variable resistor element of the second memory cell, and a third set step in which the initial voltage is applied to the word line connected to the second memory cell, the first to third set steps being carried out in the order stated;

the method carrying out, when the state of a variable resistor element of a third memory cell is read, a first read step in which a fifth voltage is applied to a word line connected to the third memory cell to turn on a field-effect transistor of the third memory cell, and a current is applied by creating a potential difference between a bit line connected to the third memory cell and the voltage supply section, whereby a value of a current flowing through the variable resistor element of the third memory cell is detected as an amount of a current flowing through the bit line.

DETAILED DESCRIPTION OF THE INVENTION

Embodiments of the present invention will be described below referring to the accompanying drawings.

Figure 1:
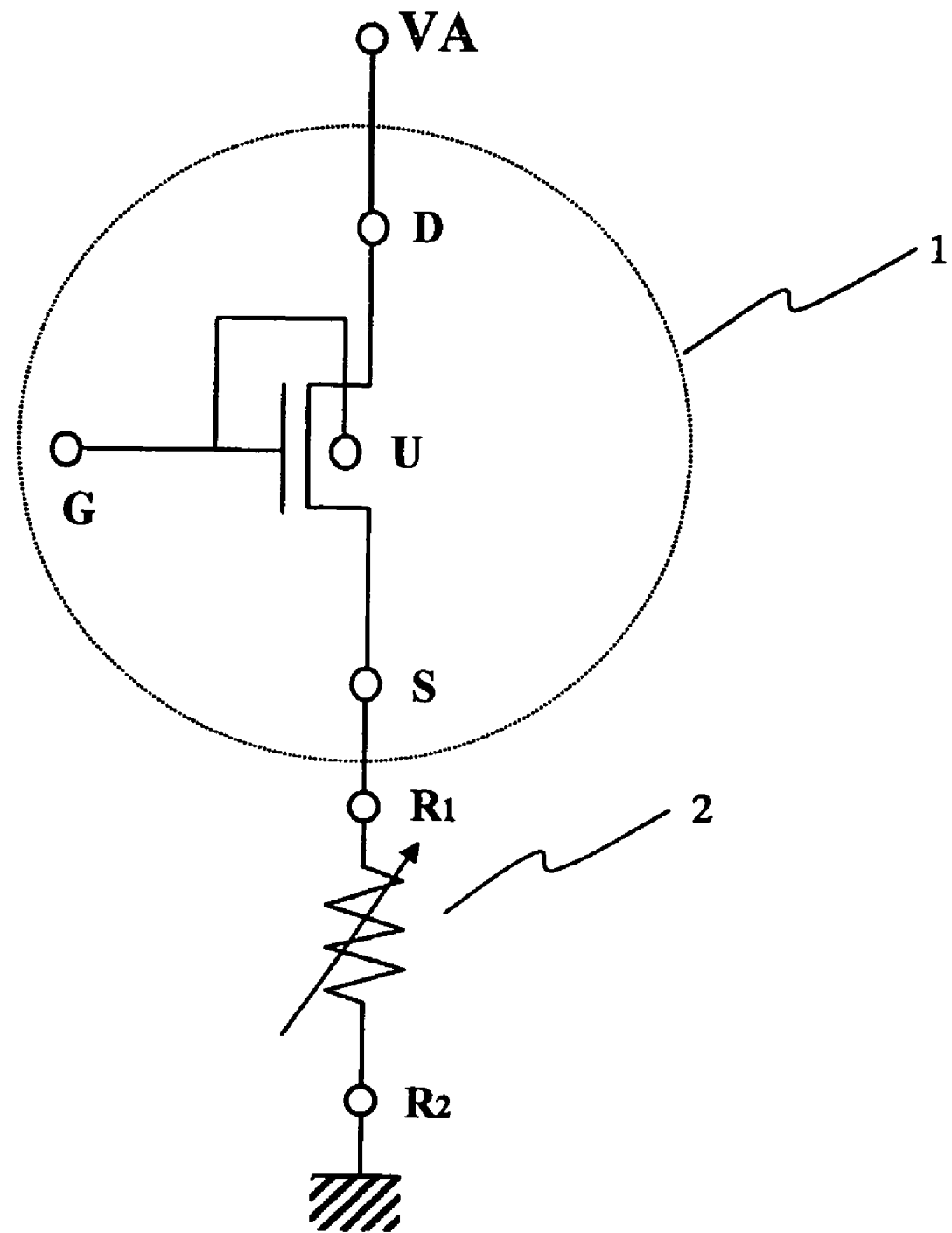
FIG. 1 is a circuit diagram of a non-volatile memory, to which the driving method according to an embodiment of the present invention is applied.

FIG. 1 is a circuit diagram of a non-volatile memory, to which the driving method according to an embodiment of the present invention is applied. This non-volatile memory comprises an n-channel MOS transistor 1 whose gate terminal G and substrate potential control terminal U are electrically connected and a variable resistor element 2 comprising phase change material such as GeSbTe (germanium-antimony-tellurium). These two elements 1 and 2 consist one memory cell, and one of two terminals of the variable resistor element, a first terminal R1, is connected to a source terminal S of the MOS transistor 1, while a second terminal R2 is grounded. A drain terminal D of the MOS transistor 1 is connected to a voltage supply terminal VA. The voltage supply terminal VA may not necessarily be connected to a voltage source but may be connected to a current source.

In FIG. 1, when a positive voltage is applied to the voltage supply terminal VA and gate terminal G, a current flows through the variable resistor element 2, which enables to set and reset the resistance value of the phase change material used for the variable resistor element 2. The threshold voltage of the MOS transistor 1 is lowered when it is on, and is raised when it is off because the gate terminal G and substrate potential control terminal U are electrically connected. This MOS transistor 1 is referred to as a DTMOS (Dynamic Threshold MOS). Accordingly, the subthreshold slope and current driving performance of the DTMOS 1 can be greatly improved, compared to a normal MOS transistor.

In case of an n-channel MOS transistor, the conductivity types of its substrate, source and drain are p-type, n+ type and n+ type, respectively, forming a pn+ junction. Thus, in FIG. 1, when a voltage higher than a forward rise voltage $V_F$ of the pn+ junction is applied to the gate terminal G, a diode forward current flows from the gate terminal G (substrate potential control terminal U) to the source terminal S. This operation is different from normal operation of the MOS transistor. This diode forward current is higher than a channel current in normal operation of the MOS transistor. In this embodiment, because the variable resistor element 2 comprises a phase change material, a relatively high current is needed to rewrite data. Therefore, when the variable resistor element 2 is reset, this bipolar-like operational mode is intentionally used.

Moreover, when reading a resistance value where a low voltage of 0.4 V or lower must be used to avoid read disturbance, rapid readout is enabled by the excellent subthreshold characteristics mentioned above. It is extremely difficult for a variable resistor element using a phase change material, which needs the application of a high current to be reset and the application of a very low voltage to be read, and a normal MOS as a switching device to achieve a space-saving, low-power-consuming and high-speed memory cell. On the other hand, as mentioned above, forming a memory cell using a DTMOS as a switching element can realize space saving. By driving this memory cell in the manner described later, the memory cell can be operated with low power consumption at a high speed.

Figure 2:
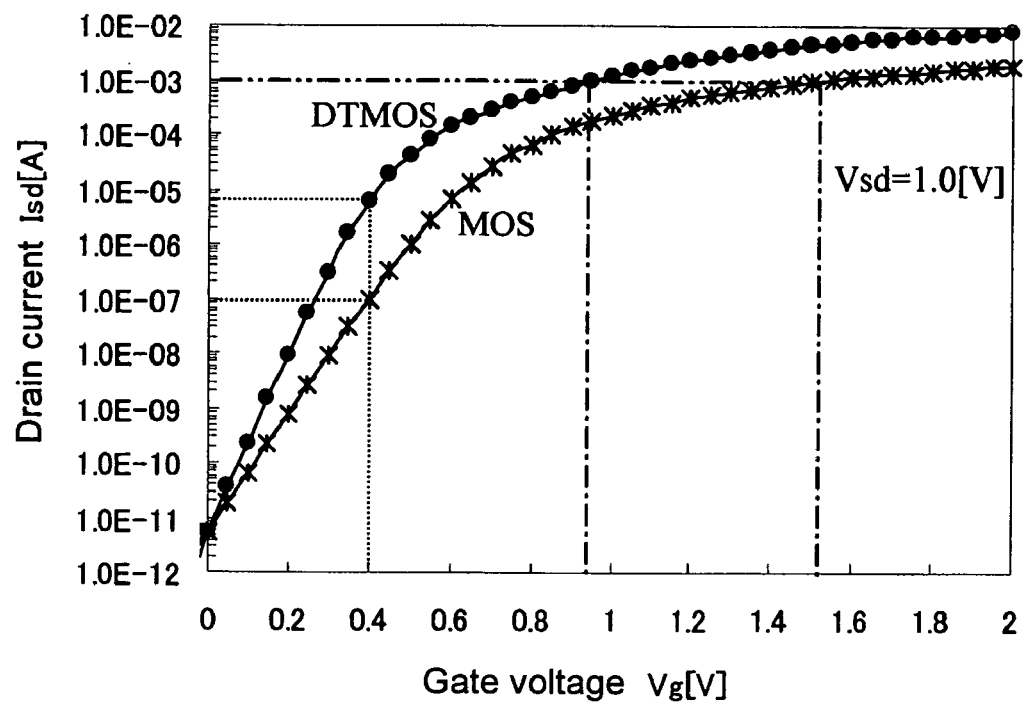
FIG. 2 shows the gate voltage-drain current characteristics of a MOS and DTMOS which can be used for the semiconductor circuit shown in FIG. 1.

FIG. 2 shows the gate voltage (Vg)-drain current (Isd) characteristics of a normal MOS and DTMOS. Both MOSs are n-channel type and have a channel length of 0.5 μm, channel width of 10 μm and gate oxide thickness of 6 nm. The drain voltage Vsd is fixed at 1.0 V.

As seen from FIG. 2, the DTMOS can obtain the drain current Isd higher than that of the normal MOS at the entire range of the gate voltages Vg except for the vicinity of 0 V, and the subthreshold slope of the DTMOS is 60 mV/dec, which is an ideal value. In case of the DTMOS having the characteristics shown in FIG. 2, when the gate voltage (=substrate potential) is set at about 0.8 V or higher, an improvement in the driving current is achieved by the bipolar-like operation mentioned above.

The advantages of using a DTMOS as a switching element for a variable resistor element will be described below. First, for example, when reading a resistance value at the gate voltage of 0.4 V, the current driving performance is higher by about two orders of magnitude as shown in FIG. 2. That is, because of the drain current Isd higher by about two orders of magnitude, high-speed readout of a resistance value is made possible.

Now, assume that the current required to reset the variable resistor element using phase change material is 1 mA. As seen from FIG. 2, the DTMOS can obtain this current value at the gate voltage of about 0.95 V, while the normal MOS needs to increase the gate voltage to about 1.5 V to attain the current value.

It is apparent from the description above that using a DTMOS as a switching element for a variable resistor element can reduce the voltage applied to the gate in reset mode by about 40%, reduce power consumption and greatly improve readout speed. It is clear that set operation carried out at the drain current Isd of 1 mA or lower is also enabled with the application of lower voltages. In addition, when a DTMOS and a normal MOS are designed to provide the same driving current, it is needless to say that a DTMOS can have much smaller element area than a MOS, because the driving current is proportional to the ratio W/L of the channel width W to channel length L of the element.

Second, the case where the ratio W/L of the channel width W to channel length L is designed to be 2 (1/10 of the case of FIG. 2) to achieve a memory cell requiring only a small area will be described. In this case, since the drain current Isd is 1/10 of the value shown in FIG. 2, a normal MOS needs to set the gate voltage Vg to as high as 3 V or higher (not shown in FIG. 2) to obtain a driving current of 1 mA. Therefore, the MOS would need an additional booster circuit as a peripheral circuit requiring a large area.

On the other hand, DTMOS would not especially need a booster current or the like because it can obtain the drain current Isd of about 1 mA at the gate voltage Vg of 2 V even if the driving current is 1/10 of the voltage shown in FIG. 2. The above description is based on FIG. 2 showing the data of the case where the drain voltage Vsd is 1 V. However, even when the drain voltage Vsd is different from 1 V, for example, Vsd=2 V, the advantages of DTMOS is not affected.

Described above is an n-channel DTMOS, but a p-channel DTMOS also has the same characteristics as mentioned above and advantages over normal p-channel MOS. It should be noted that the polarity of a voltage applied to each terminal of a p-channel DTMOS is opposite to that of an n-channel DTMOS. In case of a p-channel MOS, the conductivity types of its substrate, source and drain are n-type, p+ type and p+ type, respectively, forming a p+n junction. Accordingly, if the source (or drain) voltage $V_S$ to the gate voltage $V_G$, i.e., $V_S$-$V_G$ is higher than the forward rise voltage $V_F$ of the p+n junction, a diode forward current, which is higher than a channel current of a MOS transistor in its normal operation, flows from the source (or drain) to the gate.

Figure 3:
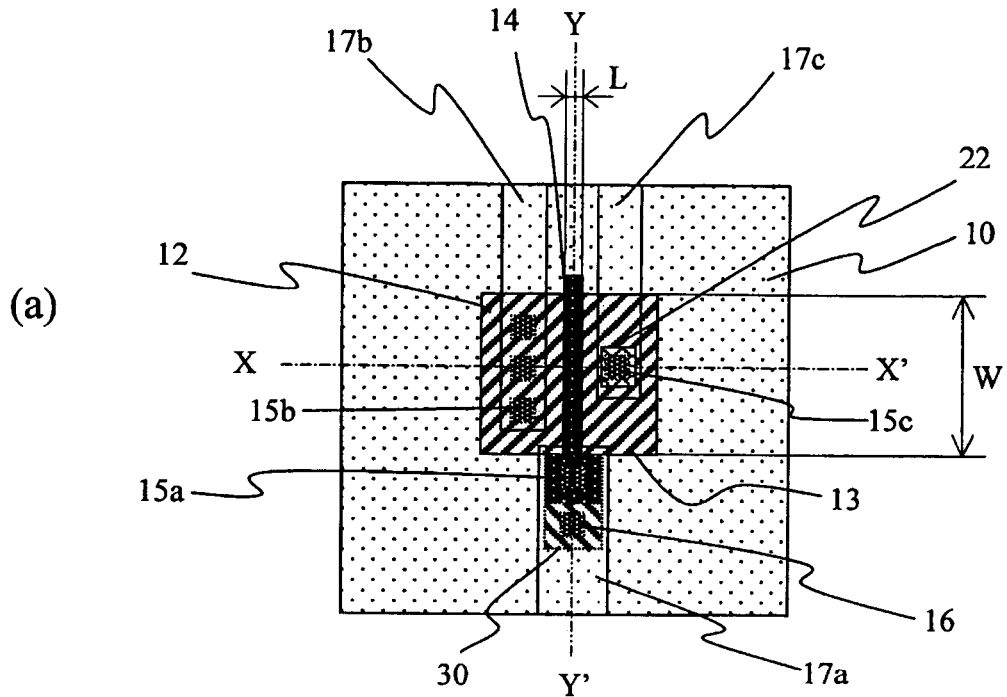
FIG. 3 schematically shows the configuration of a phase change memory cell represented by the circuit diagram of FIG. 1: (a) is a top view; (b) is a view in section taken along the line X–X' in the top view (a); and (c) is a view in section taken along the Y–Y' in the top view (a).
Figure 3:
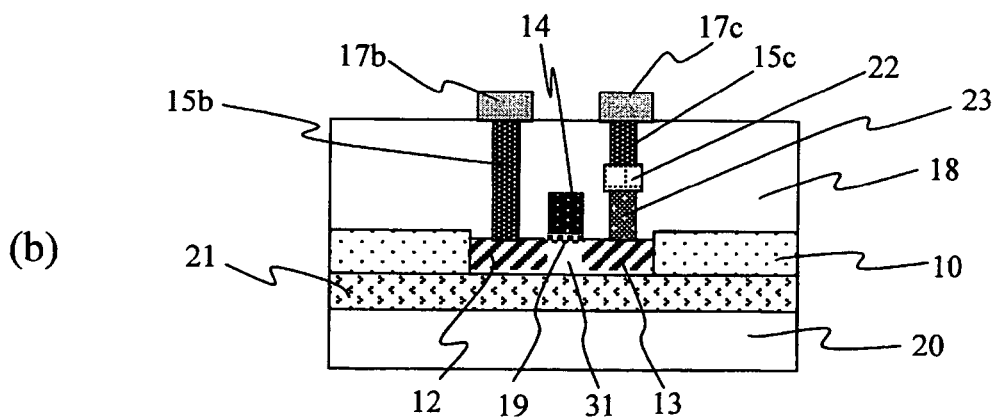
Figure 3:
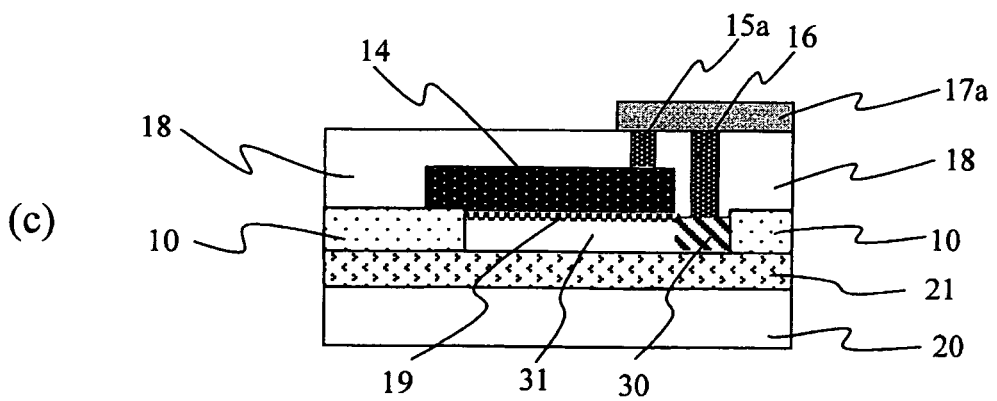

FIG. 3 schematically shows the configuration of a phrase change memory cell formed on the basis of the semiconductor circuit of FIG. 1: (a) is a top view of a phase change memory cell formed by laminating a DTMOS and a variable resistor element using phase change material on an SOI (silicon on insulator) substrate; (b) and (c) are the views in section taken along the lines X–X' and Y–Y', respectively, in the top view (a).

As shown in FIG. 3(b), this phase change memory cell has a layered structure of a silicon substrate 20, an embedded oxide film 21, an element separation oxide film 10 and an interlayer insulation film 18. Within the layered structure, a DTMOS and a variable resistor element are provided. The DTMOS has a drain region 12, a source region 13, a polysilicon gate pattern 14 and a gate oxide film 19 such as a silicon oxide film. The variable resistor element has a phase change film 22 and a heater electrode 23. This phase change memory cell also has aluminum or other metal wiring patterns 17a–17c formed on the interlayer insulation film 18 and tungsten or other metal plugs 15a–15c and 16 inserted into contact windows formed within the interlayer insulation film 18. The metal wiring patterns 17a–17c are connected to the gate pattern 14, drain region 12 and source region 13 of the DTMOS via the metal plugs 15a–15c, respectively. As shown in FIG. 3(c), the metal wiring pattern 17a is also connected to an impurity diffusion region 30, in which impurity of the type opposite to that of the drain region 12 and source region 13 is diffused, via the metal plug 16. For example, if the drain region 12 and source region 13 are n+ type, the impurity dispersed region 30 is p+ type. In FIGS. 3(a)–(c), the same components have the same numerals. In FIG. 3(a), the interlayer insulation film 18 is not shown.

For the heater electrode 23 shown in FIG. 3(b), material which has a resistivity higher than those of metals and high heat resistance, such as polysilicon, ruthenium (Ru), rhodium (Rh), iridium (Ir), osmium (Os), their oxides and the like, is used. Specifically, the material, dimension and the shape of the heater electrode 23 may be selected so that the phase change film 22 at the interface of itself and the heater electrode 23 can be made crystalline or amorphous by the heat generated by the heater electrode 23 when a current is applied to the phase change memory cell, and the resistance value of the phase change film 22 can be controlled.

For example, the material of the heater electrode 23 may be the same as that of the metal plug 15c. In such a case, the entire phase change film 22 is made crystalline or amorphous, whereby an energy necessary to control the resistance value is increased, compared to the case where a material having a resistivity higher than that of the metal plug 15c is used for the heater electrode 23.

When there is the problem of atomic diffusion between the heater electrode 23 or metal plug 15c and the phase change film 22, a barrier metal layer such as a titanium nitride film may be inserted between those elements and the phase change film 22, although it is not shown in FIG. 3(b).

As seen from FIGS. 3(a)–(c), the phase change film 22 can be layered on the DTMOS, and requires only a very small area. Therefore, the area of the entire memory cell substantially depends on that of a transistor used as a switching element. Although DTMOS requires a larger memory cell area than normal MOS because the metal plug 16 for contacting the substrate must be additionally provided for each element, considering the reduced channel width due to the increased current driving performance mentioned above, it can save much space as a whole. FIG. 3 illustrates the case where an SOI substrate is used, but it is also possible to use a bulk substrate through which wells are formed to control the substrate potential of each element.

Figure 4:
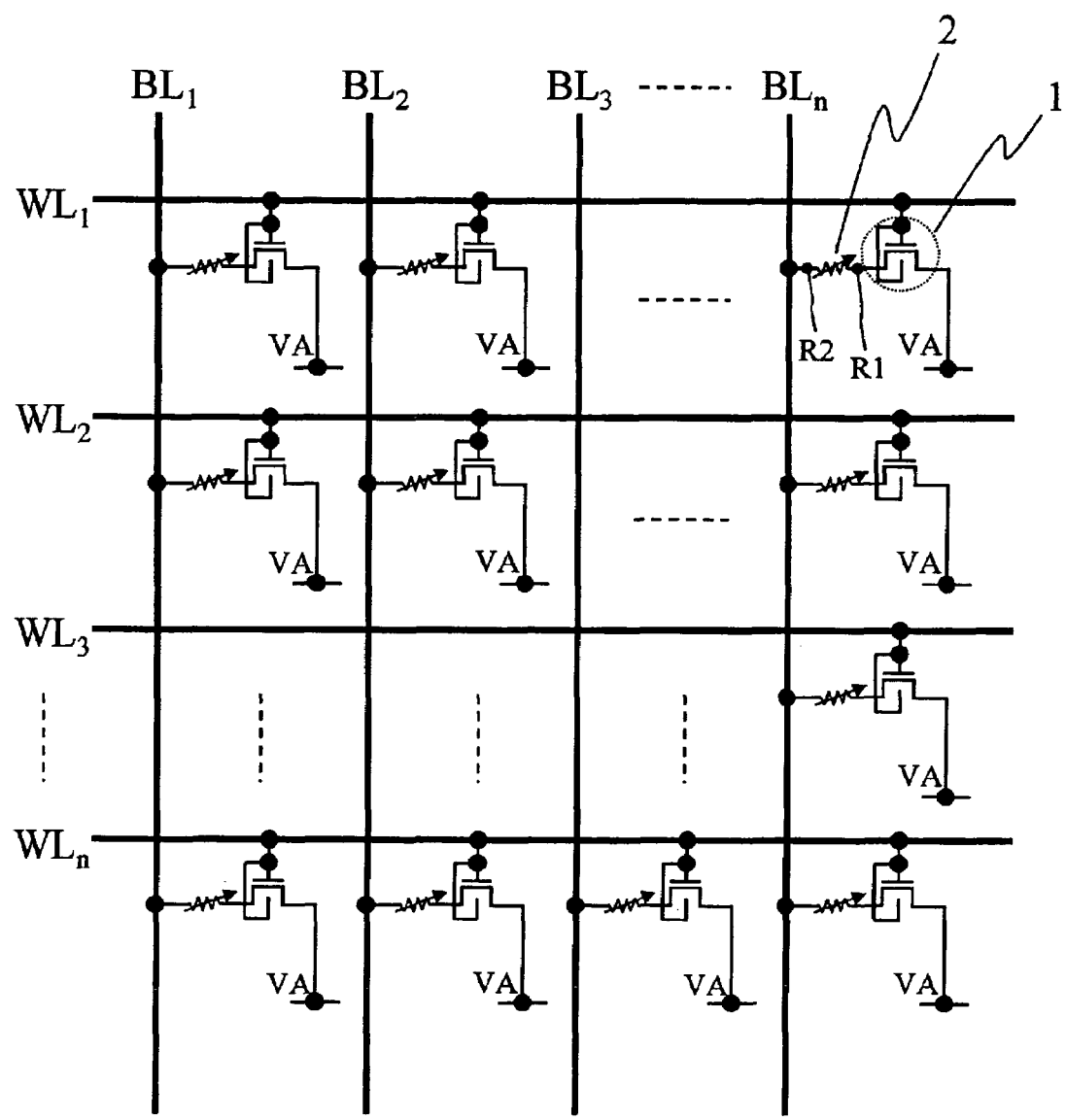
FIG. 4 is a circuit diagram of a two dimensional array memory constructed by arranging the semiconductor circuits of FIG. 1 in a two dimensional array.

FIG. 4 is a circuit diagram showing an array memory constructed by two-dimensionally arranging the memory cells having the circuit of FIG. 1. This array memory comprises a memory cell consisting of an n-channel DTMOS 1 and a variable resistor element 2 using phase change material, a bit line $BL_i$ (i is a natural number from 1 to n) for inputting and outputting data, a word line $WL_i$ (i is a natural number from 1 to n) connected to gate electrodes to control input and output by turning on/off the DTMOS 1, and a voltage supply section VA which supply voltage. More specifically, each bit line $BL_i$ is connected to a second terminal R2 of the variable resistor element 2, each word line $WL_i$ is connected to a gate terminal G of the DTMOS 1, and the voltage supply section VA is connected to a drain terminal D. A first terminal R1 of the variable resistor element 2 is connected to a source terminal of the DTMOS 1 (see FIGS. 1 and 4). Herein, all the voltage section VAs are connected in common to one voltage source or current source.

FIRST EMBODIMENT

Described below is a method of driving the non-volatile memory shown in FIG. 4, that is, the reset operation (i.e., operation to change the variable resistor element 2 into the high resistance state), set operation (i.e., operation to change the variable resistor element 2 into the low resistance state) and resistance value read operation (i.e., operation to read the resistance state of the variable resistor element 2) of the variable resistor element 2 in each memory cell 1 constituting the two-dimensional array memory.

In this first embodiment, the DTMOS 1 is an n-channel DTMOS. The case where the DTMOS 1 is a p-channel DTMOS will be described later as a second embodiment.

Figure 12:
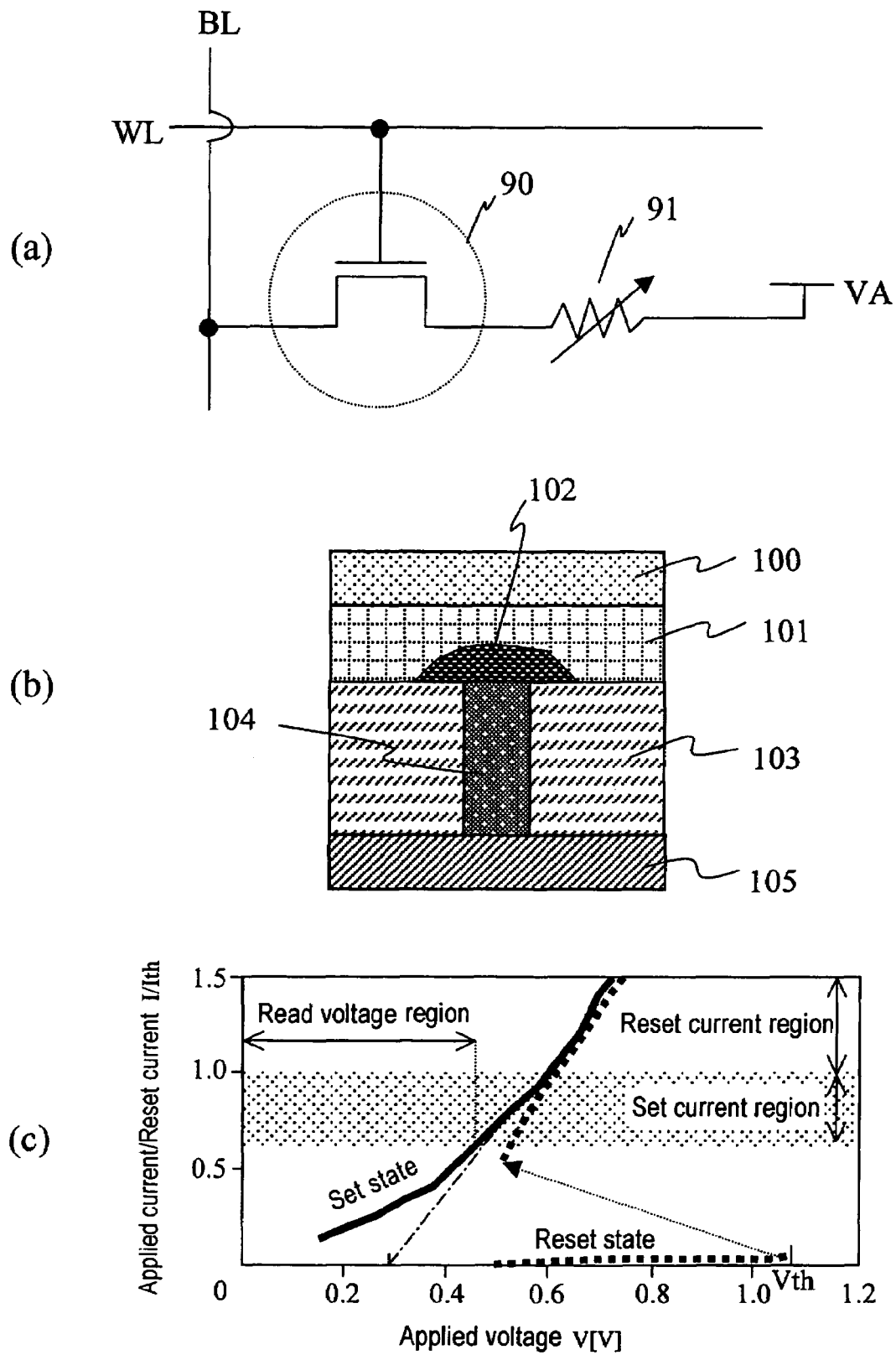
FIG. 12 illustrates a prior art phase change memory cell which uses a MOS: (a) is the circuit diagram of the phase change memory cell; (b) is the cross sectional view of a variable resistor element which uses the phase change material; and (c) shows the current-voltage characteristics of the variable resistor element which uses the phase change material.

Herein, the voltage applied to the bit line $BL_i$ is $V_B$, the voltage applied to the word line $WL_i$ is $V_W$; a forward rise voltage of the above-mentioned pn junction formed by the substrate and source (or drain) is $V_F$ (>0); the voltage applied to the voltage supply section VA is $V_A$; and the maximum voltage applied that does not cause read disturbance when reading data is $V_R$ (>0) (about 0.45 V in the example of FIG. 12(c)).

The reset operation is referred to with a numeral subscript "1", set operation with "2", and resistance value read operation with "3". For example, the voltage applied to the bit line $BL_i$ in the reset operation is referred to as "$V_{B1}$".

(Reset Operation)

Figure 5:
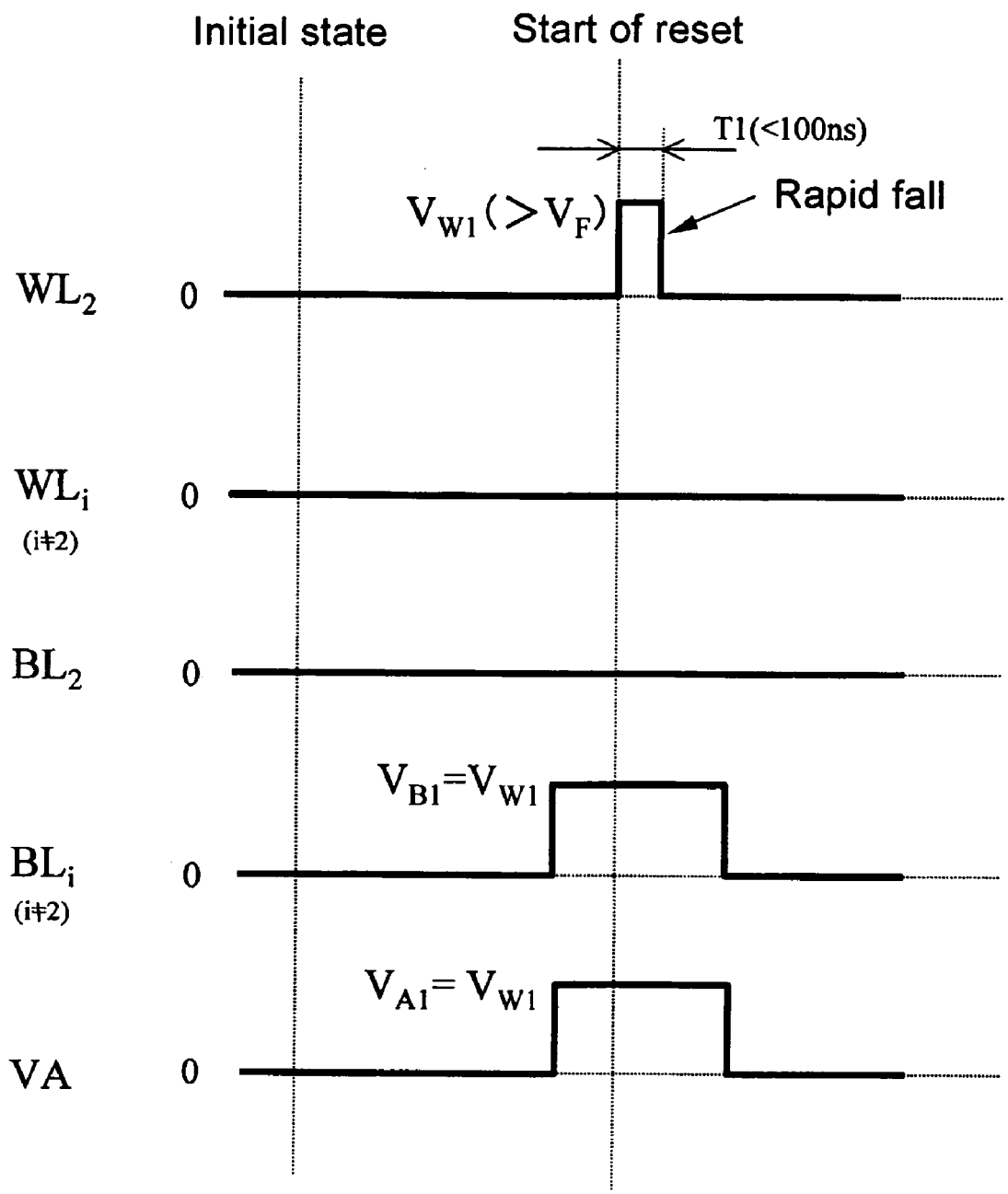
FIG. 5 is a timing chart for changing a variable resistor element in the two dimensional array memory of FIG. 4 into a high resistance state, when n-channel DTMOSs are used in the array memory.

FIG. 5 is a timing chart for applying voltage to each line of the array memory, when only the variable resistor element 2 of the memory cell (referred to as a first memory cell) connected to the bit line $BL_2$ and word line $WL_2$ is reset.

Assume that in the initial state, the voltages of all the bit lines $BL_i$ (i=1 to n), word lines $WL_i$ (i=1 to n) and voltage supply section VA are equal to an initial voltage. The initial voltage is preferably 0 V, but is not limited to 0 V as far as the state of the DTMOS 1 can be maintained off and the state of the variable resistor element 2 is not affected. Hereinafter, the voltage applied to each line is described as a voltage based on the initial voltage.

(First Reset Step)

First, while the voltages of all the word lines $WL_i$ (i=1 to n) and the bit line $BL_2$ connected to the first memory cell are maintained at the initial voltage (preferably 0 V), the voltages $V_{B1}$ and $V_{A1}$, which are positive voltages, i.e., higher than the initial voltage, are applied to the bit lines $BL_i$ (i≠2) other than the bit line $BL_2$ connected to the first memory cell and voltage supply section VA. Herein, $V_{A1}=V_{B1}$, and both voltages are set to such values that can provide the charac-teristics of the reset current region in FIG. 12(c). The same value of these positive voltages $V_{B1}$ and $V_{A1}$ is referred to as "a first voltage".

(Second Reset Step)

Second, while this state is maintained, the voltage $V_{W1}$ ($V_{W1}>V_F$, $V_{W1}=V_{A1}=V_{B1}$), which is equal to the voltage $V_{A1}$ (=$V_{B1}$) and is higher than the forward rise voltage $V_F$ of the pn junction, is applied only to the word line $WL_2$ connected to the first memory cell for a predetermined time T1. This voltage $V_{W1}$ is referred to as "a second voltage".

During this step, the initial voltage (preferably 0 V) is being applied to the word lines $WL_i$ (i≠2) other than the word line $WL_2$ connected to the first memory cell.

Therefore, in the first memory cell, a forward current of the pn junction flows from the gate terminal G to the source terminal S via the substrate having p-type impurity during the time T1. Described with reference to FIG. 3 in more detail, part of the semiconductor immediately under the gate pattern 14 (hereinafter this part of the semiconductor is referred to as "an active region" with a numeral 31) is p-type. The drain region 12 and source region 13 are n-type. The gate pattern 14 and active region 31 are connected via the metal plug 15a, electrode wiring pattern 17a, metal plug 16 and impurity diffused region 30 so that the gate pattern 14 and active region 31 have the same potential. Thus, the voltage $V_{W1}$ applied to the gate pattern 14 via the word line $WL_2$ is also applied to the active region 31. Since the pn junction is formed between the active region 31 having p-type impurity and the drain region and source region 12 and 13 having n-type impurity, a current caused by the voltage $V_{W1}$ applied to the active region 31 will flow to the drain region 12 and source region 13. If the current value caused by this is set to the value within the reset current region shown in FIG. 12(c), which sufficiently fuses the phase change material constituting the variable resistor element and then changes the material into the amorphous state, the variable resistor element 2 connected to the source terminal S can be reset, i.e., changed into the high resistance state. The time T1 is a time required to fuse the phase change material, and may be a short period, for example, 100 ns or less.

Meanwhile, the word line $WL_2$ is also connected to the gate terminals Gs of the memory cells other than the first memory cell. The voltage $V_{B1}$, which is equal to the voltage $V_{W1}$ applied to the gate terminal G, is applied to the bit lines $BL_i$ (i≠2). Therefore, in those memory cells, no voltage is applied to the pn junction between the source terminal S and the substrate and no current flows through the variable resistor element 2. More specifically, the voltage $V_{B1}$ is preliminarily applied to the bit lines $BL_i$ (i≠2) other than the bit line $BL_2$ connected to the first memory cell in order to balance the voltage $V_{W1}$ applied to the word line $WL_2$ and the voltage $V_{B1}$ so that no voltage is applied to the pn junction between the source terminal S and the substrate.

(Third Reset Step)

After the second reset step, the voltages of all the word lines $WL_i$, all the bit lines $BL_i$ and the voltage supply section VA are returned to the initial voltage (preferably 0 V). Herein, to change the phase change material, which has been once fused, into the amorphous state by rapid cooling, as pointed with the arrow in FIG. 5, it is desirable that the pulse waveform rapidly falls after the time T1 elapses.

Finally, to make the array memory return to the initial state, only the voltages of the bit lines $BL_i$ (i≠2) other than the bit line $BL_2$ connected to the first memory cell and the voltage supply section VA are returned to the initial voltage (preferably 0 V).

Described above is the case having the optimum voltage conditions, that is, $V_{A1}=V_{B1}=V_{W1}>V_F$, and the voltages $V_{W1}$, $V_{A1}$ and $V_{B1}$ are the values which can provide the characteristics of the reset current region, but it may not be $V_{A1}=V_{B1}=V_{W1}$. That is, as long as $V_{A1}=V_{B1}$, $V_{W1}>V_F$, $V_{B1}+V_F>V_{W1}\geq V_{B1}$, other voltage conditions are not required. Herein, $V_{W1}\geq V_{B1}$ is a condition under which a reverse-biased voltage is not applied to the pn junction. In this case, in the first memory cell, the voltage $V_{SB1}$ ($=V_{W1}-V_{B1}$) of the substrate (conductivity type: p-type) relative to the source terminal S (conductivity type: n+ type) is $V_{SB1}=V_{W1}(>V_F)$, and the variable resistor element can be reset by a forward current of the pn junction.

In contrast, in the memory cells connected to the word line $WL_2$ other than the first memory cell, the voltage $V_{SB1}$ ($=V_{W1}-V_{B1}$) of the substrate (conductivity type: p-type) relative to the source terminal S (conductivity type: n+ type) is in the range of $0\leq V_{SB1}<V_F$ and the voltage applied to the pn junction between the source terminal S and the substrate does not exceed the voltage $V_F$, thereby inhibiting the forward current of the pn junction.

It is also possible to reset a plurality of desired memory cells, i.e., a plurality of desired variable resistor elements 2 simultaneously. To do so, the timing chart of FIG. 5 may be changed as follows: instead of applying the voltage $V_{W1}$ only to the word line $WL_2$, the voltage $V_{W1}$ is applied the word lines $WL_j$ ($1\leq j\leq n$) connected to a plurality of desired memory cells, and the voltages of other word lines $WL_i$ ($i\neq j$) are maintained at the initial voltage (preferably 0 V); instead of applying the voltage $V_{B1}$ to the bit lines $BL_i$ ($i\neq 2$), the voltages of a plurality of bit lines $BL_k$ ($1\leq k\leq n$) are maintained at the initial voltage (preferably 0 V), and the voltage $V_{B1}$ is applied to other bit lines $BL_m$ ($m\neq k$).

Figure 6:
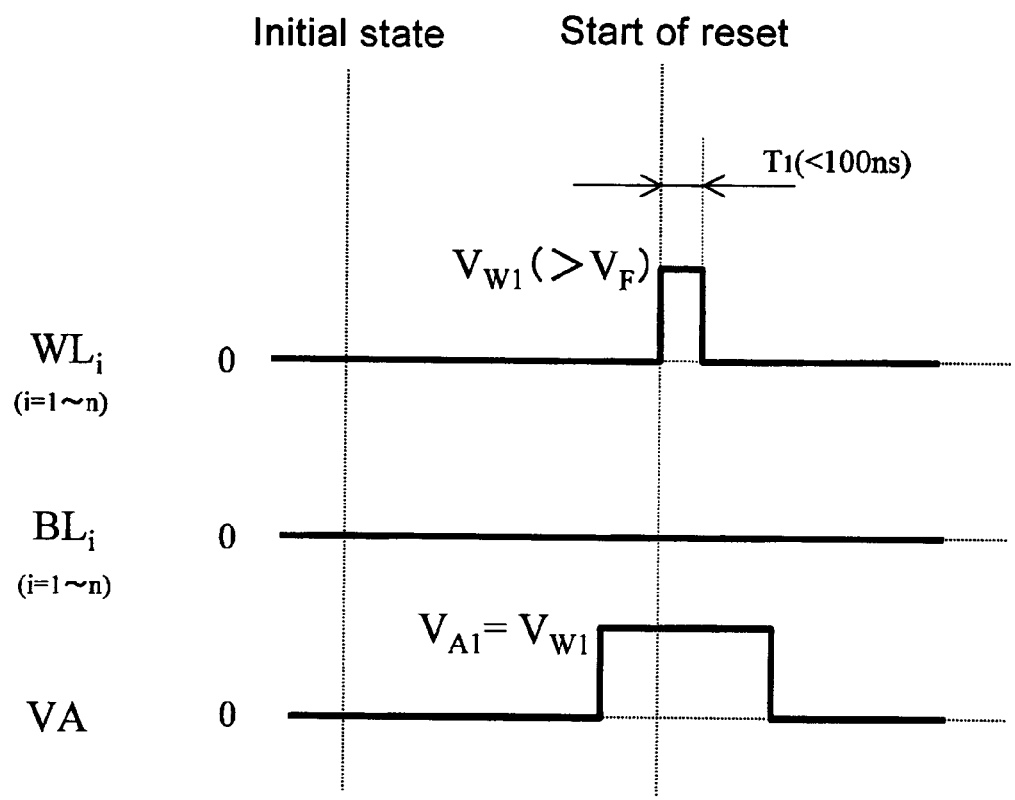
FIG. 6 is a timing chart for changing the variable resistor elements of all the memory cells in the two dimensional array memory of FIG. 4 into a high resistance state, when n-channel DTMOSs are used in the array memory.

For example, when the variable resistor elements 2 of all the memory cells are to be reset, each voltage may be applied according to the timing chart of FIG. 6. Specifically, in the initial state, the voltage $V_{A1}$ is applied to the voltage supply section VA (first reset-all step), the voltage $V_{W1}$ ($V_{W1}>V_F$, $V_{W1}=V_{A1}$) is applied to all the word lines $WL_i$ (i=1 to n) for the predetermined time T1 (second reset-all step), and then the voltages of all the word lines $WL_i$ (i=1 to n) are rapidly returned to 0 V (third reset-all step).

The reset operation described above is the case where the timing to apply the voltage $V_{B1}$ to the bit lines $BL_i$ ($i\neq 2$) and the timing to apply the voltage $V_{A1}$ to the voltage supply section VA are the same. However, one of the voltages $V_{B1}$ and $V_{A1}$ may be applied earlier than the other as long as both of these voltages are applied before the voltage $V_{W1}$ is applied to the predetermined word line $WL_2$. Likewise, as for the timings for returning the voltages of the bit lines $BL_i$ ($i\neq 2$) and voltage supply section VA to the initial voltage (preferably 0 V), one of them may be returned to the initial voltage earlier than the other as long as they are returned the initial voltage after the voltage $V_{W1}$ of the predetermined word line $WL_2$ has been returned to the initial voltage.

(Set Operation)

Second, a set operation, in which the resistance value of the phase change material of the variable resistor element 2 is lowered, will be described. When only the variable resistor element 2 of the memory cell (to clarify that it is not necessarily the same memory cell as the above first memory cell, it is referred to as a second memory cell herein) connected to the bit line $BL_2$ and word line $WL_2$ is to be set, the timing sequence of applying a voltage to each line is as shown in FIG. 7.

Figure 7:
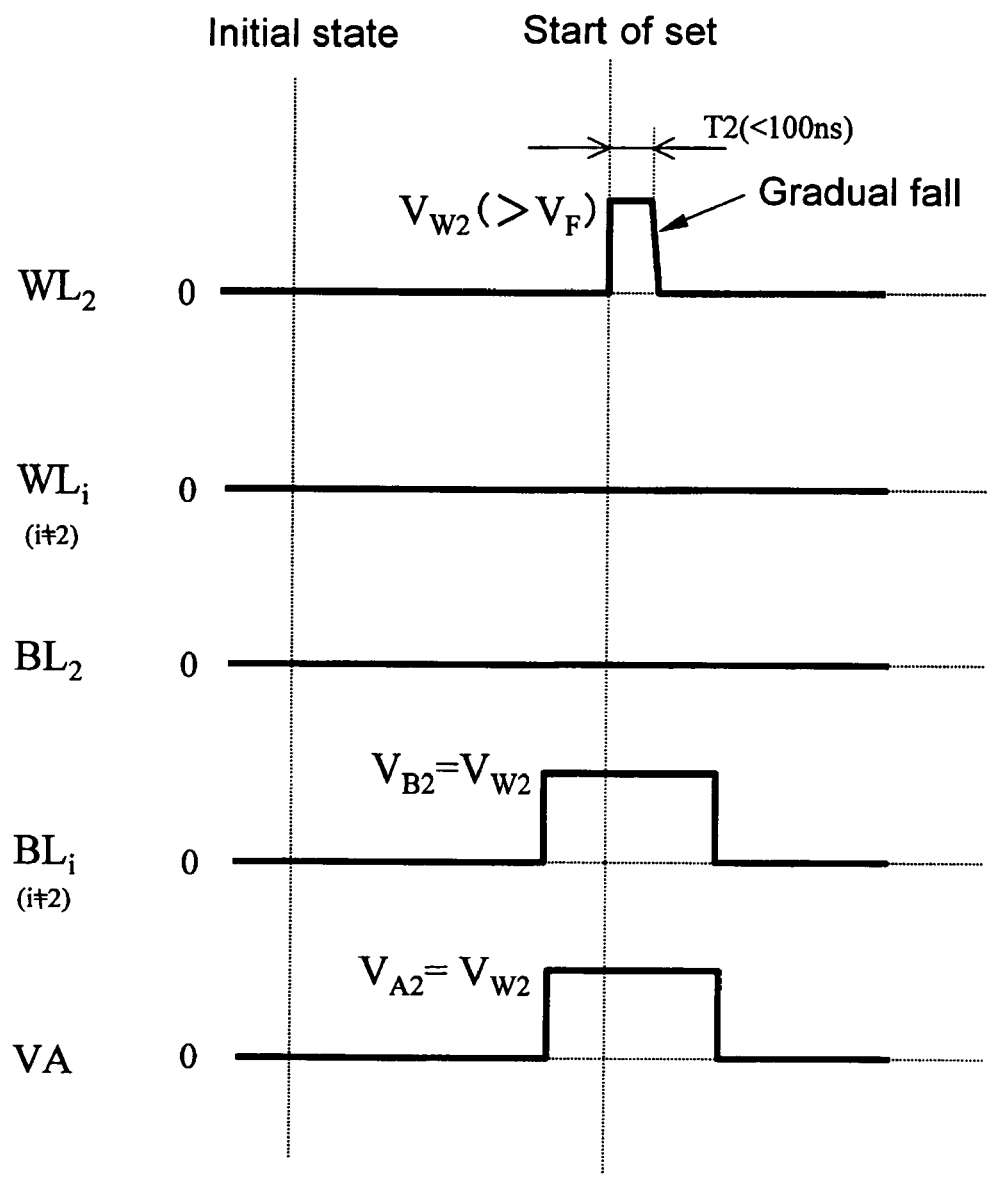
FIG. 7 is a timing chart for changing the variable resistor element in the two dimensional array memory of FIG. 4 into a low resistance state, when n-channel DTMOSs are used in the array memory.

This timing sequence shown in FIG. 7 is basically the same as that shown in FIG. 5.

(First Set Step)

Specifically, first, while the voltages of all the word lines $WL_i$ (i=1 to n) and the bit line $BL_2$ connected to the second memory cell are maintained at the initial voltage (preferably 0 V), the voltages $V_{B2}$ and $V_{A2}$, which are positive, i.e., higher than the initial voltage, are applied to the bit lines $BL_i$ ($i\neq 2$) other than the bit line $BL_2$ connected to the second memory cell and the voltage supply section VA, respectively. Herein, $V_{A2}=V_{B2}$, and all the voltages are set at such values that can provide the characteristics of the set current region in FIG. 12(c). The same value of these positive voltages $V_{B2}$ and $V_{A2}$ is referred to as "a third voltage".

(Second Set Step)

Second, while this state is maintained, the voltage $V_{W2}$ ($V_{W2}>V_F$, $V_{W2}=V_{A2}=V_{B2}$), which is equal to the voltage $V_{A2}$ ($=V_{B2}$) and higher than the forward rise voltage $V_F$ of the pn junction, is applied only to the word line $WL_2$ connected to the second memory cell for a predetermined time T2. This positive voltage $V_{W2}$, i.e., voltage higher than the initial voltage, is referred to as "a fourth voltage".

During this time, the initial voltage (preferably 0 V) is being applied to the word lines $WL_i$ ($i\neq 2$) other than the word line $WL_2$ connected to the second memory cell.

Accordingly, during the time T2 in the second memory cell, a forward current of the pn junction flows from the gate terminal G to the source terminal S via the substrate having p-type impurity. If this current value is set to a value in the set current region that crystallizes the phase change material forming the variable resistor element as shown in FIG. 12(c), it is possible to set the variable resistor element 2 connected to the source terminal S, i.e., change the element into the low resistance state. The time T2 is a time necessary to crystallize the phase change material, and may be a short period such as 100 ns or less.

In contrast, the word line $WL_2$ is also connected to the gate terminals G of the memory cells other than the second memory cell. In those memory cells, the voltage $V_{B2}$, which is equal to the voltage $V_{W2}$ applied to the gate terminal G, is applied to the bit lines $BL_i$ ($i\neq 2$), and therefore no voltage is applied to the pn junction between the source terminal S and substrate, allowing no current in the variable resistor element 2. Specifically, the voltage $V_{B2}$ is preliminarily applied to the bit lines $BL_i$ ($i\neq 2$) other than the bit line $BL_2$ connected to the second memory cell in order to balance the voltage $V_{W2}$ applied to the word line $WL_2$ and the voltage $V_{B2}$ so that no voltage is applied to the pn junction between the source terminal S and substrate.

(Third Set Step)

After the second set step, the voltages of all the word lines $WL_i$, all the bit lines $BL_i$ and the voltage supply section are returned to the initial voltage (preferably 0 V). At this time, to crystallize the phase change material, as pointed with the arrow in FIG. 7, it is desirable that the fall in the pulse waveform after the time T2 elapses is gentle.

Finally, to make the memory return to the initial state, the voltages of only the bit lines $BL_i$ ($i\neq 2$) other than the bit line $BL_2$ connected to the first memory cell and the voltage supply section VA are changed to return to the initial voltage (preferably 0 V).

Thus, in the set operation, the voltages $V_{W2}$, $V_{B2}$ and $V_{A2}$ applied to the word line $WL_2$ connected to the second memory cell, the bit lines $BL_i$ (i≠2) other than the bit line $BL_2$ connected to the second memory cell and the voltage supply section VA, respectively, need to be determined according to the current-voltage characteristics of the variable resistor element.

Also in this case, it should at least be $V_{A2}=V_{B2}$ and $V_{B2}+V_F>V_{W2}\geq V_{B2}$, preferably $V_{A2}=V_{B2}=V_{W2}$. For example, in case of FIG. 12(c), it is necessary to carry out the set operation within the voltage range that gives a 60–100% current value of the reset current value. If variable resistor elements are set at the same resistance value, the higher the set current value, the shorter the time to apply voltage to the variable resistor element may be, it must be done within the voltage range up to the reset current value. Therefore, the relationship $V_{A1}>V_{A2}$ is valid (this also applies to $V_{B2}$, etc.).

As in the reset operation, it is also possible to set a plurality of desired memory cells simultaneously, or set all the memory cells simultaneously by suitably changing the bit lines $BL_i$ and word lines $WL_j$ to apply voltages. In addition, the timings of applying the voltage $V_{B2}$ to the bit lines $BL_i$ (i≠2) and applying the voltage $V_{A2}$ to the voltage supply section VA may not be the same, i.e., one of them may be applied earlier than the other. The timings of returning the voltages of the bit lines $BL_i$ (i≠2) and the voltage supply section VA to the initial voltage (preferably 0 V) may not be the same either, i.e., one of them may be returned to the initial voltage earlier than the other.

(Resistance Value Read Operation)

Finally, a resistance value read operation, in which the resistance value of the predetermined variable resistor element 2 is selectively read, will be described. The following operation sequence is referred to as a first read step in this specification.

Herein, the DTMOS 1 is operated in the same manner as a normal MOS transistor. In this step, the memory cell to be read is referred to as a third memory cell to clarify that it is not necessarily the same memory cell as the first memory cell or second memory cell mentioned above, and reading the state (resistance value) of the variable resistor element in this third memory cell will be described.

First, a fifth voltage is applied to the word line $WL_2$ connected to the third memory cell to turn on the DTMOS 1 connected to the word line $WL_2$.

Further, a potential difference is created between the bit line $BL_2$ connected to the third memory cell and the voltage supply section VA. This causes a current to flow between the bit line $BL_2$ and voltage section VA. By sensing this current by a sense amplifier (not shown in FIGS.) or the like connected to the bit line $BL_2$ connected to the third memory cell, the current value flowing through the variable resistor element 2 in the third memory cell is detected as the amount of the current flowing through the bit line $BL_2$.

It should be noted that the fifth voltage, the voltage applied to the bit line $BL_2$ connected to the third memory cell to cause the potential difference and the voltage applied to the voltage supply section VA are all equal to or lower than the maximum voltage $V_R$, which does not cause read disturbance, applied in read operation. That is, these voltages are within the read voltage region shown in FIG. 12(c).

After a potential difference between the bit line $BL_2$ connected to the third memory cell and the voltage supply section VA has been created, the fifth voltage may be applied to the word line $WL_2$.

Figure 8:
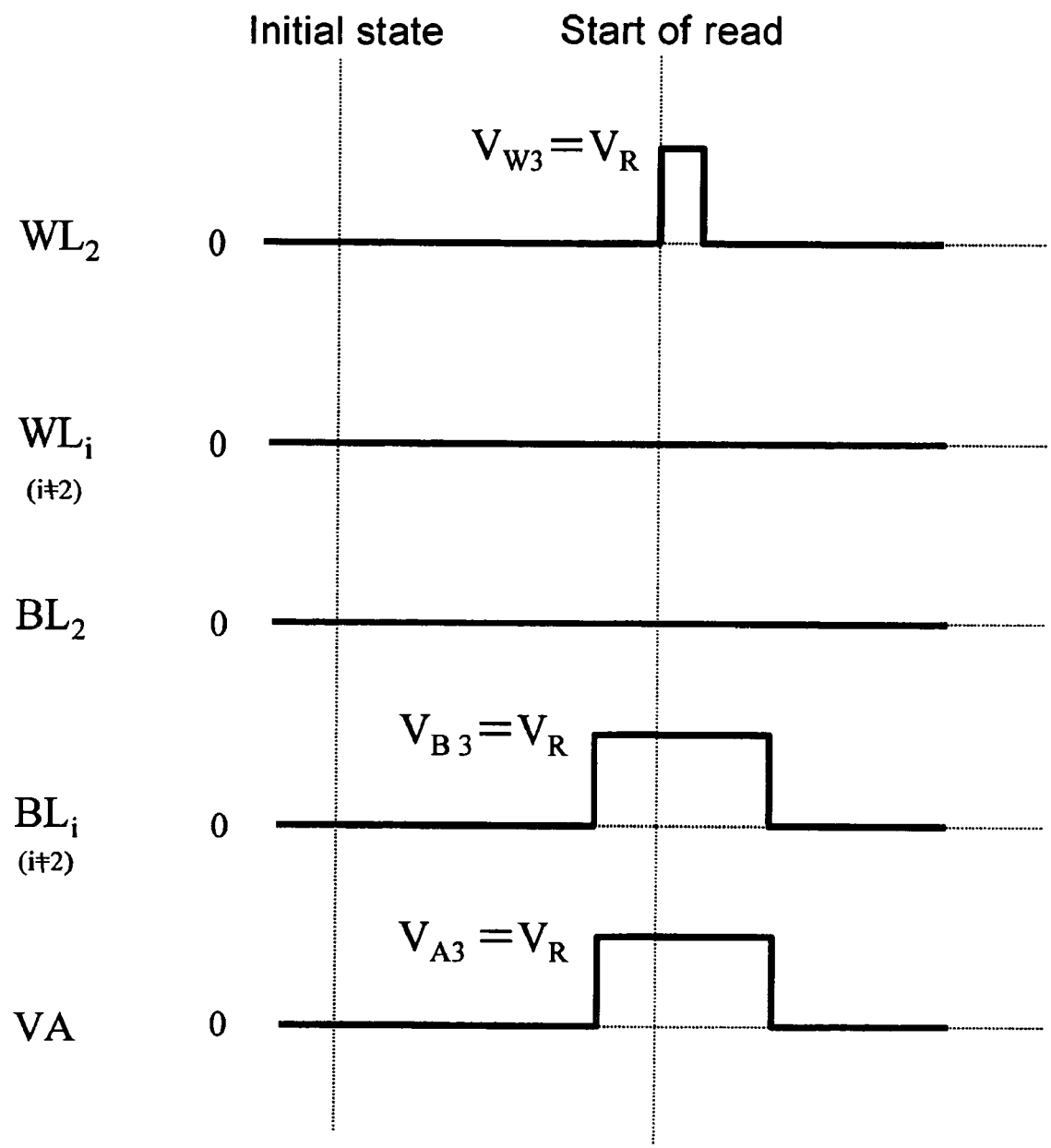
FIG. 8 is a timing chart for reading the resistance value of the variable resistor element in the two dimensional array memory of FIG. 4, when n-channel DTMOSs are used in the array memory.

Reading resistance values may also be conducted according to the timing chart of FIG. 8.

FIG. 8 is a timing chart for applying voltage to each line when the resistance value of the variable resistor element 2 of the third memory cell connected to the bit line $BL_2$ and word line $WL_2$ is read. This timing chart of FIG. 8 is similar to FIGS. 5 and 7, except that all the voltages are equal to or lower than the maximum voltage $V_R$, which does not cause read disturbance, applied in read operation. For this reason, only a brief explanation of FIG. 8 is provided below.

In the initial state, as already mentioned, it is assumed that the voltages of all the bit lines $BL_i$ (i=1 to n), word lines $WL_i$ (i=1 to n) and voltage supply section VA are equal to the initial voltage (preferably 0 V).

First, while the voltages of all the word lines $WL_i$ (i=1 to n) and the bit line $BL_2$ connected to the third memory cell are maintained at the initial voltage (preferably 0 V), positive voltages $V_{B3}$ (=$V_R$) and $V_{A3}$ (=$V_R$) are applied to the bit lines $BL_i$ (i≠2) other than the bit line $BL_2$ connected to the third memory cell and the voltage supply section VA, respectively. Second, while this state is maintained, the voltage $V_{W3}$ (=$V_R$) is applied to the word line $WL_2$ connected to the third memory cell for a predetermined time, and the voltage is then returned to the initial voltage (preferably 0 V). During this time, the initial voltage (preferably 0 V) is being applied to the word lines $WL_i$ (i≠2) other than the word line $WL_2$ connected to the third memory cell. In the state that the voltage $V_{W3}$ (=$V_R$) is applied to the word line $WL_2$, the current value flowing through the bit line $BL_2$ is detected using a sense amplifier or the like, whereby the resistance value of the variable resistor element 2 of the selected third memory cell can be obtained, that is, the data written in the third memory cell can be read. Finally, from that state, the voltages of the bit lines $BL_i$ (i≠2) other than the bit line $BL_2$ connected to the third memory cell and the voltage supply section VA are returned to the initial voltage (preferably 0 V) so that the selected state of the third memory cell is cancelled and the initial state is regained.

Described above is the case where the voltages $V_{A3}$, $V_{B3}$ and $V_{W3}$ are all equal to the maximum voltage $V_R$, which does not cause read disturbance, applied in read operation. However, these voltages are not necessarily as above as long as these voltages are in the read current region in FIG. 12(c) and the voltages $V_{A3}$ and $V_{B3}$ are the same. Usually, a voltage in the read voltage region is sufficiently lower than the forward rise voltage $V_F$ of the pn junction, and thus no forward current of the pn junction flows in the DTMOS 1 constituting each memory cell.

As in the reset operation and set operation, the timings of applying the voltage $V_{B3}$ to the bit lines $BL_i$ (i≠2) and applying the voltage $V_{A3}$ to the voltage supply section VA may not be the same, i.e., one of them may be applied earlier than the other. The timings of returning the voltages of the bit lines $BL_i$ (i≠2) and the voltage supply section VA to their initial voltages (preferably 0 V) may not be the same either, i.e., one of them may be returned to the initial voltage earlier than the other.

SECOND EMBODIMENT

The case where an array memory is formed by using n-channel DTMOSs was described in the first embodiment, but p-channel DTMOSs may also be used. In that case, the memory may be driven in a similar manner to that mentioned above, except that polarities of the voltages applied in FIGS. 5–8 are reversed.

Figure 9:
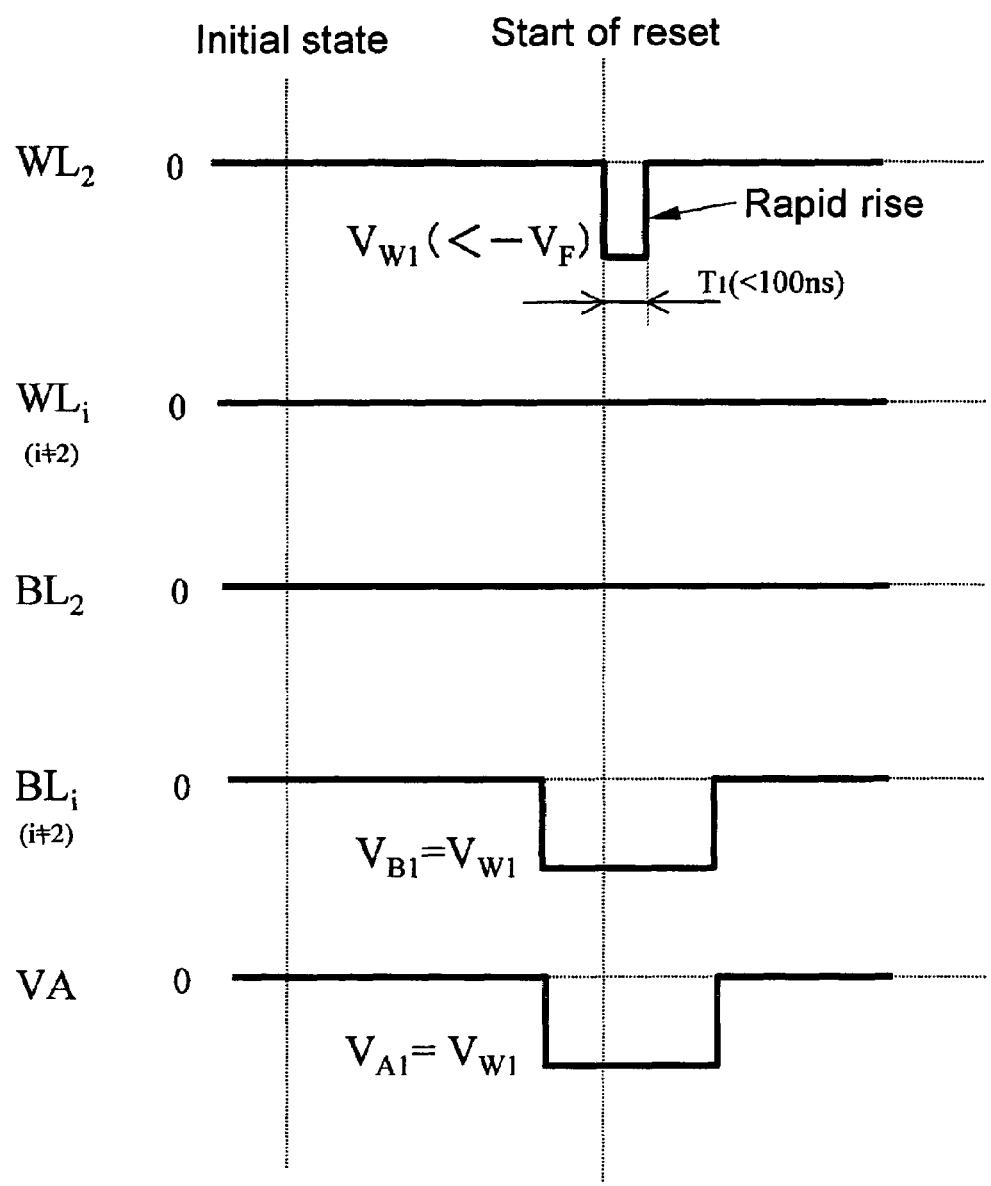
FIG. 9 is a timing chart for changing the variable resistor element in the two dimensional array memory of FIG. 4 into a high resistance state, when p-channel DTMOSs are used in the array memory.
Figure 10:
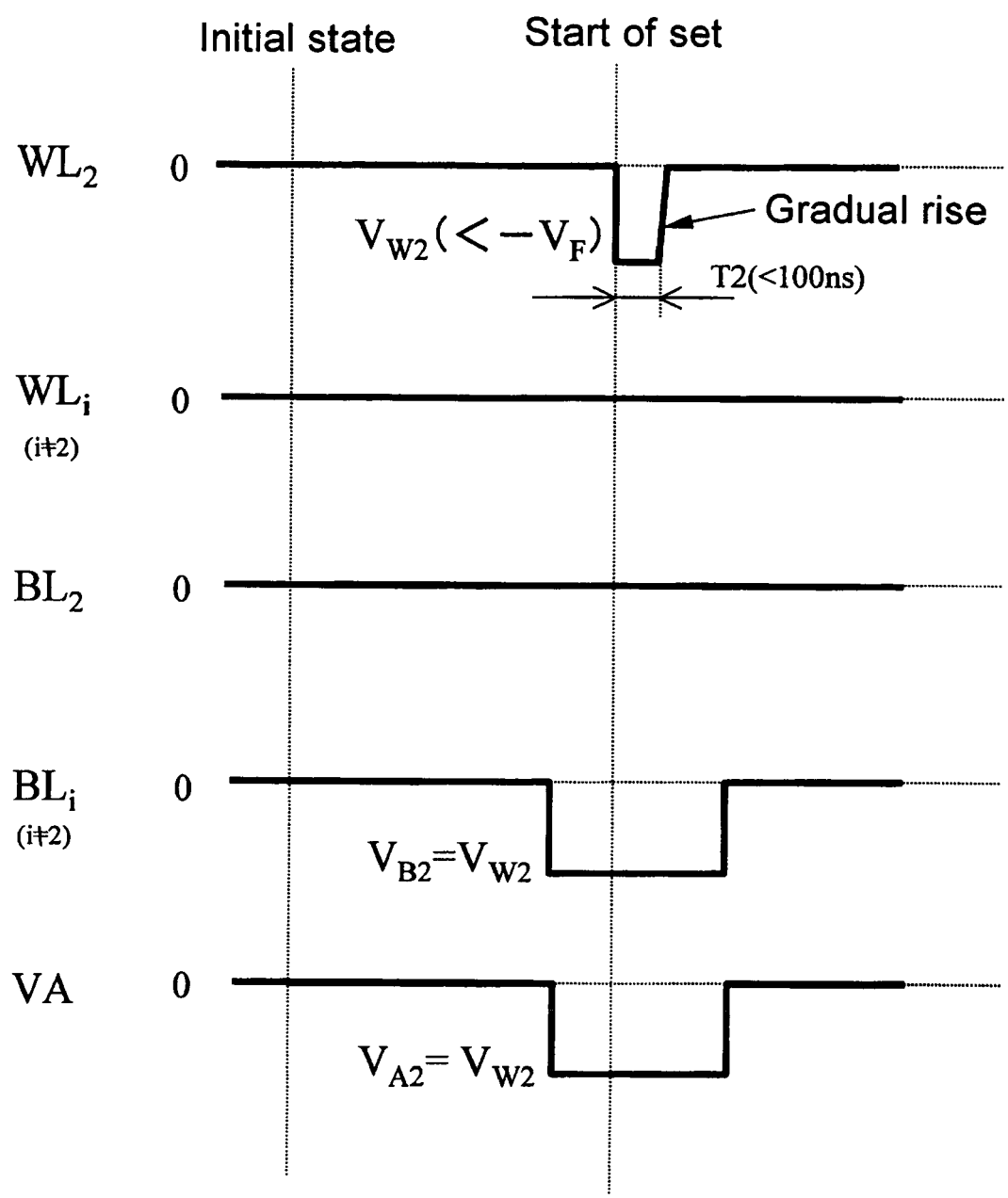
FIG. 10 is a timing chart for changing the variable resistor element in the two dimensional array memory of FIG. 4 into a low resistance state, when p-channel DTMOSs are used in the array memory.
Figure 11:
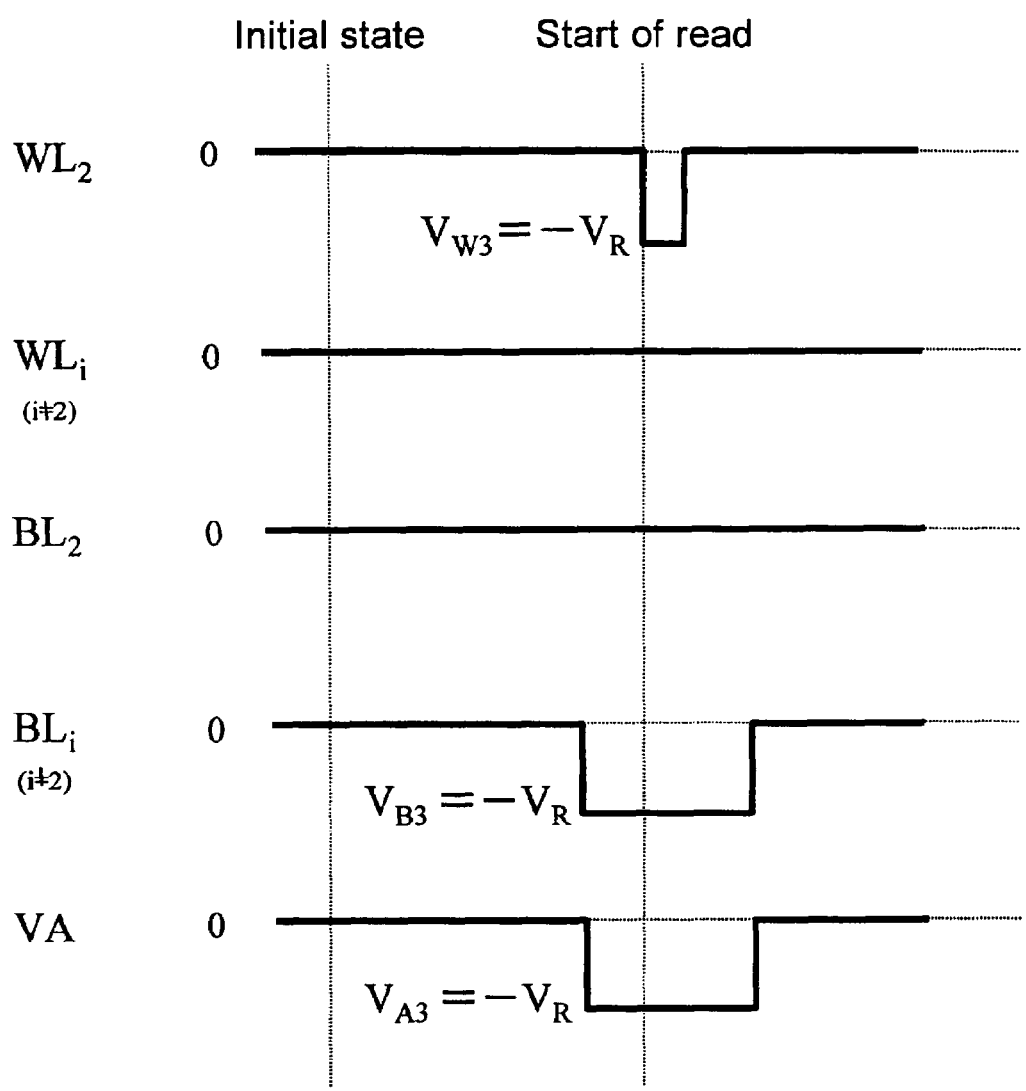
FIG. 11 is a timing chart for reading the resistance value of the variable resistor element in the two dimensional array memory of FIG. 4, when p-channel DTMOSs are used in the array memory.

As an example, timing charts for driving an array memory constructed in a similar manner to that shown in FIG. 4 by using p-channel DTMOSs are shown in FIGS. 9–11. The set operation, reset operation and resistance value read operation of an array memory using p-channel DTMOSs will be described below.

(Reset Operation)

FIG. 9 is a timing chart showing the voltage applied to each line when only the variable resistor element 2 of a memory cell (referred to as a first memory cell) connected to a bit line $BL_2$ and word line $WL_2$ is reset (corresponding to FIG. 5).

Assume that in the initial state, the voltages of all the bit lines $BL_i$ (i=1 to n), word lines $WL_i$ (i=1 to n) and voltage supply section VA are an initial voltage (0 V). An example of the initial voltages is 0 V, but it is not limited to 0 V as long as the state of the DTMOS can be maintained off and the state of the variable resistor element 2 is not affected. In particular, it may be a positive voltage (e.g., 3 V). In this case, as described later, a non-volatile memory can be driven at a voltage equal to or higher than 0 V.

(First Reset Step)

First, while the voltages of all the word lines $WL_i$ (i=1 to n) and bit line $BL_2$ connected to the first memory cell are maintained at the initial voltage, the voltages $V_{B1}$ and $V_{A1}$, which are lower than their initial voltage, are applied to the bit lines $BL_i$ (i≠2) other than the bit line $BL_2$ connected to the first memory cell and voltage supply section VA. Herein, $V_{A1}=V_{B1}$, and all the voltages are set to such values that can provide the characteristics of the reset current region in FIG. 12(c). The same value of these voltages $V_{B1}$ and $V_{A1}$ is referred to as "a first voltage".

It should be noted that in this specification, when two voltages are compared and one voltage is said to be lower than the other, it means that the former is absolutely lower than the latter taking their signs into consideration, not that the former is lower than the latter in terms of their absolute values. For example, when "−5 V" and "−10 V" are compared, it is said that "−10 V" is lower than "−5 V" in this specification.

(Second Reset Step)

Second, while this state is maintained, a second voltage $V_{W1}$, which is lower than the initial voltage and makes a forward rise current flow through the pn junction of the field-effect transistor, is applied for a predetermined time T1 only to the word line $WL_2$ connected to the first memory cell. This second voltage is, for example, equal to the voltage $V_{A1}$ (=$V_{B1}$).

This second voltage is, when the initial voltage is 0 V, a negative voltage $V_{W1}$ ($V_{W1}$<−$V_F$, $V_{W1}$=$V_{A1}$=$V_{B1}$) having a higher absolute value than a forward rise voltage $V_F$ (>0) of the pn junction formed between an n-type active region 31 and p-type source and drain regions. It is, for example, a voltage of about −3 V to −2 V.

The second voltage is, when its initial voltage is 3 V, about 0 V to 1 V, for example.

The time T1 is a time required to fuse the phase change material, and needs to fulfill the same conditions as in the case where an n-channel DTMOS is used.

During this time, the initial voltage is being applied to the word lines $WL_i$ (i≠2) other than the word line $WL_2$ connected to the first memory cell.

Therefore, during the time T1, a forward current of the pn junction flows from the source terminal S to the gate terminal G via the substrate comprising n-type impurity in the first memory cell. Described with reference to FIG. 3 in more detail, the active region 31 is n-type, the drain region 12 and source region 13 are p-type. The gate pattern 14 and active region 31 are connected to each other via the metal plug 15a, electrode wiring pattern 17a, metal plug 16 and impurity dispersed region 30 so that the drain region 12 and source region 13 have the same electrical potential. Accordingly, the voltage $V_{B1}$ applied to the source region 13 via the bit line $BL_2$ is also applied to the active region 31. Since the pn junction is formed between the drain and source regions 12 and 13 having p-type impurity and the active region having n-type impurity, a current will flow to the gate pattern 14 via the active region 31 because of the voltage $V_{B1}$ applied to the source region 13. If the value of the thus-caused current is set to be in the reset current region shown in FIG. 12(c), which can sufficiently fuse the phase change material forming the variable resistor element and then change the material into the amorphous state, the variable resistor element 2 connected to the source terminal S can be reset, i.e., changed into the high resistance state. The time T1 is a time required to fuse the phase change material, and may be a short period such as 100 ns or less.

In contrast, the word line $WL_2$ is also connected to the gate terminals G of the memory cells other than the first memory cell. In these memory cells, the voltage $V_{B1}$, which is equal to the voltage $V_{W1}$ applied to the gate terminal G, is applied to the bit lines $BL_i$ (i≠2). Therefore, in those memory cells, no voltage is applied to the pn junction between the source terminal S and substrate, preventing a current flow through the variable resistor element 2. Specifically, the voltage $V_{B1}$ is preliminarily applied to the bit lines $BL_i$ (i≠2) other than the bit line $BL_2$ connected to the first memory cell in order to balance the voltage $V_{W1}$ applied to the word line $WL_2$ and the voltage $V_{B1}$ SO that no voltage is applied to the pn junction of the source terminal S and substrate.

(Third Reset Step)

After the second reset step, the voltages of all the word lines $WL_i$ and all the bit lines $BL_i$ and the voltage supply section VA are returned to the initial voltage. At this time, to make the phase change material which has been once fused into the amorphous state by rapid cooling, as pointed with the arrow in FIG. 9, it is desirable that the pulse waveform rapidly rises after the time T1 elapses.

Finally, to make the memory return to the initial state, the voltages of only the bit lines $BL_i$ (i≠2) other than the bit line $BL_2$ connected to the first memory cell and the voltage supply section VA are changed to return to the initial voltage.

Described above is the case having the voltage condition of, when the initial voltages are 0 V, $V_{A1}=V_{B1}=V_{W1}$<−$V_F$, and the absolute values of the voltages $V_{W1}$, $V_{A1}$ and $V_{B1}$ are the voltage values which can provide the characteristics of the reset current region, but it may not be $V_{A1}=V_{B1}=V_{W1}$. That is, as long as $V_{A1}=V_{B1}$, $V_{W1}$<−$V_F$, $V_{B1}$−$V_F$<$V_{W1}$≦$V_{B1}$, other voltage conditions are not required. In this case, in the first memory cell, the voltage $V_{SB1}$ (=$V_{B1}$−$V_{W1}$) of the source terminal S (conductivity type: p+ type) relative to the substrate (conductivity type: n-type) is $V_{SB1}$=−$V_{W1}$>$V_F$, and the variable resistor element can be reset by a forward current of the pn junction.

In contrast, in the memory cells connected to the word line $WL_2$ other than the first memory cell, the voltage $V_{SB1}$ (=$V_{W1}$−$V_{B1}$) of the source terminal S (conductivity type: p+ type) relative to the substrate (conductivity type: n-type) is in the range of 0≦$V_{SB1}$<$V_F$ and the voltage applied to the pn junction between the source terminal S and substrate does not exceed the voltage $V_F$, whereby a forward current of the pn junction can be inhibited.

As in case where n-channel DTMOSs are used, it is also possible to reset a plurality of desired memory cells simultaneously, or reset all the memory cells simultaneously.

(Set Operation)

A set operation, in which the resistance value of the phase change material of the variable resistor element is lowered, will be described next. When only the variable resistor element of the memory cell (to clarify that it is not necessarily the same memory cell as the above first memory cell, it is referred to as a second memory cell herein) connected to the bit line $BL_2$ and word line $WL_2$ is to be set, the timing sequence of applying a voltage to each line is as shown in FIG. 10.

This timing sequence shown in FIG. 10 is basically the same as that of the reset operation shown in FIG. 9.

(First Set Step)

First, while the voltages of all the word lines $WL_i$ (i=1 to n) and the bit line $BL_2$ connected to the second memory cell are maintained at the initial voltage, the voltages $V_{B2}$ and $V_{A2}$ are applied to the bit lines $BL_i$ (i≠2) other than the bit line $BL_2$ connected to the second memory cell and the voltage supply section VA, respectively. Herein, $V_{A2}=V_{B2}$, and both voltages are set at such values that can give the characteristics of the set current region in FIG. 12(c). The same value of these voltages $V_{B2}$ and $V_{A2}$ is referred to as "a third voltage".

(Second Set Step)

Second, and a fourth voltage $V_{W2}$, which is lower than the initial voltage and makes a forward rise current flow through the pn junction of the field-effect transistor, is applied to the word line $WL_2$ connected to the second memory cell, thereby allowing a set current to flow to the variable resistor element of the second memory cell.

In this second set step, which is nearly the same as the second set step of the first embodiment, the voltages $V_{W2}$, $V_{B2}$ and $V_{A2}$ applied to the word line $WL_2$ connected to the second memory cell, the bit lines $BL_i$ (i≠2) other than the bit line $BL_2$ connected to the second memory cell and the voltage supply section VA, respectively, need to be determined according to the current-voltage characteristics of the variable resistor element. Also in this case, it should at least be $V_{A2}=V_{B2}$ and $V_{B2}-V_F<V_{W2}\leq V_{B2}$, preferably $V_{A2}=V_{B2}=V_{W2}$. When the initial voltage is 0 V, $V_{A2}$ is −2 V to −3 V. When the initial voltage is 3 V, $V_{A2}$ is 0 to 1 V. Also in this case, as described in the second reset step, a forward current of the pn junction flows from the p-type source region 13 to the n-type active region 31, both of which form the pn junction.

As in the case where n-channel DTMOSs are used, it is also possible to set a plurality of desired memory cells simultaneously, or set all the memory cells simultaneously.

(Third Set Step)

After the second set step, the voltages of all the word lines $WL_i$ and all the bit lines $BL_i$ and the voltage supply section VA are returned to the initial voltage. At this time, to change the phase change material into the amorphous state, as pointed with the arrow in FIG. 10, it is desirable that the pulse waveform slowly rises after the time T2 elapses.

Finally, to make the memory return to the initial state, the voltages of only the bit lines $BL_i$ (i≠2) other than the bit line $BL_2$ connected to the second memory cell and the voltage supply section VA are changed to return to the initial voltage.

(Resistance Value Read Operation)

Finally, a resistance value read operation, in which the resistance value of a predetermined variable resistor element 2 is selectively read, will be described. The following operation sequence is referred to as a first read step in this specification.

Herein, the DTMOS 1 is operated in the same manner as a normal MOS transistor. In this step, the memory cell to be read is referred to as a third memory cell to clarify that it is not necessarily the same memory cell as the first memory cell or second memory cell mentioned above, and reading the state (resistance value) of the variable resistor element in this third memory cell will be described.

First, a fifth voltage is applied to the word line $WL_2$ connected to the third memory cell, whereby the DTMOS 1 connected to the word line $WL_2$ is turned on.

Further, a potential difference is created between the bit line $BL_2$ connected to the third memory cell and the voltage supply section VA. Thus, a current flows between these bit line $BL_2$ and voltage supply section VA. By sensing this current by a sense amplifier (not shown in FIGS.) or the like connected to the bit line $BL_2$ connected to the third memory cell, the current value flowing through the variable resistor element 2 in the third memory cell is detected as the amount of the current flowing through the bit line $BL_2$.

The fifth voltage may be applied to the word line $WL_2$ after a potential difference has been created between the bit line $BL_2$ connected to the third memory cell and voltage supply section VA.

The resistance value may also be read according to the timing chart of FIG. 11.

FIG. 11 is a timing chart for applying voltage to each line when the resistance value of the variable resistor element 2 of the third memory cell connected to the bit line $BL_2$ and word line $WL_2$ is read.

As in the above, assume that in the initial state, the voltages of all the bit lines $BL_i$ (i=1 to n), word lines $WL_i$ (i=1 to n) and voltage supply section VA are 0 V or 3 V.

First, while the voltages of all the word lines $WL_i$ (i=1 to n) and the bit line $BL_2$ connected to the third memory cell are maintained at their initial voltage, i.e., 0 V, negative voltages $V_{B3}$ ($=-V_R$) and $V_{A3}$ ($=-V_R$) are applied to the bit lines $BL_i$ (i≠2) other than the bit line $BL_2$ connected to the third memory cell and the voltage supply section VA, respectively. When the initial voltage is 3 V, the voltage $V_{B2}$ and other voltages are not necessarily negative, and may be positive voltages which are lower than the initial voltage.

Second, while this state is maintained, the voltage $V_{W3}$ ($=-V_R$) is applied to the word line $WL_2$ connected to the third memory for a predetermined time, and then it is returned to the initial voltage (0 V). During this time, the initial voltage (0 V), is being applied to the word lines $WL_i$ (i≠2) other than the word line $WL_2$ connected to the third memory cell.

In the state that the voltage $V_{W3}$ ($=-V_R$) is applied to the word line $WL_2$, the current value flowing through the bit line $BL_2$ is detected using a sense amplifier or the like, whereby the resistance value of the variable resistor element 2 of the selected third memory cell can be obtained, that is, the data written in the third memory cell can be read.

Finally, from that state, the voltages of the bit lines $BL_1$ (i≠2) other than the bit line $BL_2$ connected to the third memory cell and the voltage supply section VA are returned to the initial voltage (0 V) so that the selected state of the third memory cell is cancelled and the initial state is regained.

Described above is the case where the absolute values of the voltages $V_{A3}$, $V_{B3}$ and $V_{W3}$ are all equal to the maximum voltage $V_R$, which does not cause read disturbance, applied in read operation. However, these voltages are not necessarily as mentioned above as long as these voltages are in the read voltage region in FIG. 12(c) and the voltages $V_{A3}$ and $V_{B3}$ are the same.

As in the case where n-channel DTMOSs are used, the above set operation, reset operation and resistance value read operation of the array memory using p-channel DTMOSs, the timings of applying the voltage $V_B$ to the bit lines $BL_i$ (i≠2) and applying the voltage $V_A$ to the voltage supply section VA may not be the same, i.e., one of them may be applied earlier than the other. The timings of returning the voltages of the bit lines $BL_i$ (i≠2) and the voltage supply section VA to the initial voltage (0 V) may not be the same either, i.e., one of them may be returned to the initial voltage earlier than the other.

As mentioned above, in a non-volatile memory having a variable resistor element, using a DTMOS with greatly improved subthreshold characteristic and driving current compared to a normal MOS as a switching element and driving the DTMOS in the above-described manner can reduce power consumption and allows high-speed read operation of the memory.

Since memory cells using phase change material show a wide range of variation in their resistance values after being produced, all memory cells need to be set or reset once before being shipped or programmed with predetermined data. Therefore, the driving sequence shown in FIG. 6 is very effective in such a case because it can simplify the initial value setting step.

In the description of the set operation, reset operation and resistance value read operation of the array memory using n-channel or p-channel DTMOSs, the voltage of each line is 0 V in the initial state. However, as already stated, the voltage is not limited to 0 V, and may be biased at a certain voltage. In that case, the voltage applied to each line can be set at such a voltage that is the sum of the above voltage and the certain bias voltage.

Further, described above is a variable resistor element using phase change material which produces many advantages when using a DTMOS as a switching element, but it may be any element whose resistance value can be varied by the application of a voltage or current. For example, an element made of a manganese-based perovskite oxide, whose resistance value is varied by the application of a voltage, sandwiched by two metal electrodes may be used as a variable resistor element.

The method of driving a non-volatile memory described as this embodiment characteristically uses the bipolar-like operation region of the DTMOS at a reset operation. This effectiveness is not lost even when a current value required for driving a variable resistor element is low. When a DTMOS is used as a switching element, compared to a prior art MOS, a drain current can be raised in the entire gate voltage region. Therefore, space-saving of the memory cell and reduced power consumption due to low voltage operation can produce significant advantages.

INDUSTRIAL APPLICABILITY

According to the present invention, a method of driving a non-volatile memory, which can read data faster with lower power consumption using as a switching element a DTMOS whose gate and substrate are electrically connected, can be provided.

What is claimed is:

1. A method of driving a non-volatile memory which comprises;
   a plurality of memory cells arranged in a two dimensional array, each of the memory cells having an n-channel field-effect transistor whose gate and substrate are connected electrically, and a variable resistor element comprising a phase change material and having a first terminal and a second terminal, the first terminal being connected to a source of the field-effect transistor,
   a word line connected to the gates of the memory cells of each line,
   a bit line connected to the second terminals of the memory cells of each row, and
   a common voltage supply section connected to drains of all the field effect transistors;
   the method carrying out, when a variable resistor element in a first memory cell is changed into a high resistance state,
   a first reset step in which an initial voltage is applied to all the word lines and a bit line connected to the first memory cell, and a first voltage which is higher than the initial voltage is applied to the voltage supply section and bit lines other than the bit line connected to the first memory cell,
   a second reset step in which a second voltage is applied to a word line connected to the first memory cell, the second voltage being, on the basis of the initial voltage, higher than a forward rise voltage of a pn junction of the field-effect transistor, higher than or equal to the first voltage and lower than the sum of the first voltage and the forward rise voltage, whereby a reset current is applied through a variable resistor element of the first memory cell, and
   a third reset step in which the initial voltage is applied to the word line connected to the first memory cell,
   the first to third reset steps being carried out in the order stated;
   the method carrying out, when a variable resistor element of a second memory cell is changed into a low resistance state,
   a first set step in which the initial voltage is applied to all the word lines and a bit line connected to the second memory cell, and a third voltage which is higher than the initial voltage is applied to the voltage supply section and bit lines other than the bit line connected to the second memory cell,
   a second set step in which a fourth voltage is applied to a word line connected to the second memory cell, the fourth voltage being, on the basis of the initial voltage, higher than a forward rise voltage of a pn junction of the field-effect transistor, higher than or equal to the third voltage and lower than the sum of the third voltage and the forward rise voltage, whereby a set current is applied through the variable resistor element of the second memory cell, and
   a third set step in which the initial voltage is applied to the word line connected to the second memory cell,
   the first to third set steps being carried out in the order stated;
   the method carrying out, when the state of a variable resistor element of a third memory cell is read,
   a first read step in which a fifth voltage is applied to a word line connected to the third memory cell to turn on a field-effect transistor of the third memory cell, and a current is applied by creating a potential difference between a bit line connected to the third memory cell and the voltage supply section, whereby a value of a current flowing through the variable resistor element of the third memory cell is detected as an amount of a current flowing through the bit line.

2. A method of driving a non-volatile memory according to claim 1, wherein in the third reset step, the initial voltage is rapidly applied.

3. A method of driving a non-volatile memory according to claim 1, where in the third set step, the initial voltage is gradually applied.

4. A method of driving a non-volatile memory according to claim 2, wherein in the third set step, the initial voltage is gradually applied.

5. A method of driving a non-volatile memory according to claim 1, wherein the initial voltage is 0 V.

6. A method of driving a non-volatile memory according to claim 1, the method comprising, when all the variable resistor elements are changed into the high resistance state,
a first reset-all step in which the initial voltage is applied to all the word lines and all the bit lines, and the first voltage is applied to the voltage supply section,
a second reset-all step in which the second voltage is applied to all the word lines, and
a third reset-all step in which the initial voltage is applied to all the word lines,
the first to third reset-all steps being carried out in the order stated.

7. A method of driving a non-volatile memory according to claim 1, the method comprising, when all the variable resistor elements are changed into the low resistance state,
a first set-all step in which the initial voltage is applied to all the word lines and all the bit lines, and the third voltage is applied to the voltage supply section,
a second set-all step in which the fourth voltage is applied to all the word lines, and
a third set-all step in which the initial voltage is applied to all the word lines,
the first to third set-all steps being carried out in the order stated.

8. A method of driving a non-volatile memory according to claim 1, wherein the phase change material comprises at least one element selected from germanium, antimony and tellurium.

9. A method of driving a non-volatile memory according to claim 8, wherein the second voltage is higher than 0.8 V, and the fourth voltage is not lower than 0.4 V but not higher than 0.8 V.

10. A method of driving a non-volatile memory which comprises;
a plurality of memory cells arranged in a two dimensional array, each of the memory cells having a p-channel field-effect transistor whose gate and substrate are connected electrically, and a variable resistor element comprising a phase change material and having a first terminal and a second terminal, the first terminal being connected to a source of the field-effect transistor,
a word line connected to the gates of the memory cells of each line,
a bit line connected to the second terminals of the memory cells of each row, and
a common voltage supply section connected to drains of all the field effect transistors;
the method carrying out, when a variable resistor element in a first memory cell is changed into a high resistance state,
a first reset step in which an initial voltage is applied to all the word lines and a bit line connected to the first memory cell, and a first voltage which is lower than the initial voltage is applied to the voltage supply section and bit lines other than the bit line connected to the first memory cell,
a second reset step in which a second voltage which is lower than the initial voltage and causes a forward rise current to flow through a pn junction of the field-effect transistor is applied to the word line connected to the first memory cell, whereby a reset current is applied through a variable resistor element of the first memory cell, and
a third reset step in which the initial voltage is applied to the word line connected to the first memory cell,
the first to third reset steps being carried out in the order stated;
the method carrying out, when a variable resistor element of a second memory cell is changed into a low resistance state,
a first set step in which the initial voltage is applied to all the word lines and a bit line connected to the second memory cell, and a third voltage which is lower than the initial voltage is applied to the voltage supply section and bit lines other than the bit line connected to the second memory cell,
a second set step in which a fourth voltage which is lower than the initial voltage and causes a forward rise current to flow through a pn junction of the field-effect transistor is applied to the word line connected to the second memory cell, whereby a set current is applied through the variable resistor element of the second memory cell, and
a third set step in which the initial voltage is applied to the word line connected to the second memory cell,
the first to third set steps being carried out in the order stated;
the method carrying out, when the state of a variable resistor element of a third memory cell is read,
a first read step in which a fifth voltage is applied to a word line connected to the third memory cell to turn on a field-effect transistor of the third memory cell, and a current is applied by creating a potential difference between a bit line connected to the third memory cell and the voltage supply section, whereby a value of a current flowing through the variable resistor element of the third memory cell is detected as an amount of a current flowing through the bit line.

11. A method of driving a non-volatile memory according to claim 10, wherein in the third reset step, the initial voltage is rapidly applied.

12. A method of driving a non-volatile memory according to claim 10, wherein in the third set step, the initial voltage is gradually applied.

13. A method of driving a non-volatile memory according to claim 11, wherein in the third set step, the initial voltage is gradually applied.

14. A method of driving a non-volatile memory according to claim 10, wherein the initial voltage is 0 V.

15. A method of driving a non-volatile memory according to claim 10, the method comprising, when all the variable resistor elements are changed into the high resistance state,
a first reset-all step in which the initial voltage is applied to all the word lines and all the bit lines, and the first voltage is applied to the voltage supply section,
a second reset-all step in which the second voltage is applied to all the word lines, and a third reset-all step in which the initial voltage is applied to all the word lines, the first to third reset-all steps being carried out in the order stated.

16. A method of driving a non-volatile memory according to claim 10, the method comprising, when all the variable resistor elements are changed into the low resistance state, a first set-all step in which the initial voltage is applied to all the word lines and all the bit lines, and the third voltage is applied to the voltage supply section, a second set-all step in which the fourth voltage is applied to all the word lines, and a third set-all step in which the initial voltage is applied to all the word lines, the first to third set-all steps being carried out in the order stated.

17. A method of driving a non-volatile memory according to claim 10, wherein the phase change material comprises at least one element selected from germanium, antimony and tellurium.

18. A method of driving a non-volatile memory according to claim 17, wherein the second voltage is lower than −0.8 V, the third voltage is not higher than −0.4 V but not lower than −0.8 V, and the fourth voltage is higher than −0.4 V.

* * * * *